ас| United States Patent | (10) Patent No.: US 10,931,238 B2
Megretski et al. | (45) Date of Patent: Feb. 23, 2021

(54) LINEARIZATION WITH ENVELOPE TRACKING OR AVERAGE POWER TRACKING

(71) Applicant: NanoSemi, Inc., Waltham, MA (US)

(72) Inventors: Alexandre Megretski, Concord, MA (US); Zohaib Mahmood, Ashland, MA (US); Yan Li, Lexington, MA (US); Kevin Chuang, Cambridge, MA (US); Helen H. Kim, Sudbury, MA (US); Yu-Chen Wu, Bedford, MA (US)

(73) Assignee: NanoSemi, Inc., Waltham, MA (US)

( * ) Notice: Subject to any disclaimer, the term of this patent is extended or adjusted under 35 U.S.C. 154(b) by 20 days.

(21) Appl. No.: 16/386,755

(22) Filed: Apr. 17, 2019

(65) Prior Publication Data
US 2019/0363676 A1 Nov. 28, 2019

Related U.S. Application Data

(60) Provisional application No. 62/676,613, filed on May 25, 2018.

(51) Int. Cl.
*H03F 1/02* (2006.01)
*H03F 1/26* (2006.01)
(Continued)

(52) U.S. Cl.
CPC .......... *H03F 1/0227* (2013.01); *H03F 1/26* (2013.01); *H03F 3/245* (2013.01); *H04B 1/0475* (2013.01); *H03F 2200/102* (2013.01)

(58) Field of Classification Search
CPC .......... H03F 1/0227; H03F 3/245; H03F 1/26; H03F 2200/102; H03F 3/19;
(Continued)

(56) References Cited

U.S. PATENT DOCUMENTS 4,979,126 A 12/1990 Pao et al.
5,819,165 A 10/1998 Hulkko et al.
(Continued)

FOREIGN PATENT DOCUMENTS

CN 101379718 A 3/2009
CN 101971507 A 2/2011
(Continued)

OTHER PUBLICATIONS

Aguirre, et al., "On the Interpretation and Practice of Dynamical Differences Between Hammerstein and Wiener Models", IEEE Proceedings on Control TheoryAppl; vol. 152, No. 4, Jul. 2005, pp. 349-356.
(Continued)

*Primary Examiner* — Hieu P Nguyen
(74) *Attorney, Agent, or Firm* — Occhiuti & Rohlicek LLP

(57) ABSTRACT

Disclosed are systems, devices, modules, methods, and other implementations, including a method for digital predistortion that includes receiving, by a digital predistorter, a first signal that depends on amplitude variations based on an input signal, u, with the variations of the first signal corresponding to time variations in non-linear characteristics of a transmit chain that includes a power amplifier. The method further includes receiving, by the digital predistorter, the input signal u, generating, by the digital predistorter, based at least in part on signals comprising the input signal u and the first signal, a digitally predistorted signal v to mitigate the non-linear behavior of the transmit chain, and providing the predistorted signal v to the transmit chain.

18 Claims, 8 Drawing Sheets

(51) Int. Cl.
    *H03F 3/24*     (2006.01)
    *H04B 1/04*     (2006.01)
(58) Field of Classification Search
    CPC .... H03F 2200/447; H03F 1/30; H03F 1/3247;
                    H03F 1/025; H04B 1/0475; H04B
                                            2001/0425
    USPC .................. 330/136, 297, 149, 127, 279
    See application file for complete search history.

(56)                References Cited

U.S. PATENT DOCUMENTS

| | | | |
|---|---|---|---|
| 5,980,457 | A | 11/1999 | Averkiou |
| 6,052,412 | A | 4/2000 | Ruether et al. |
| 6,240,278 | B1 | 5/2001 | Midya et al. |
| 6,288,610 | B1 | 9/2001 | Miyashita |
| 6,549,067 | B1 | 4/2003 | Kenington |
| 7,289,773 | B2 | 10/2007 | Braithwaite |
| 7,295,815 | B1 | 11/2007 | Wright et al. |
| 7,321,264 | B2 | 1/2008 | Kokkeler |
| 7,333,557 | B2 | 2/2008 | Rashev et al. |
| 7,469,491 | B2 | 12/2008 | McCallister et al. |
| 7,529,652 | B1 | 5/2009 | Gahinet et al. |
| 7,577,211 | B2 | 8/2009 | Braithwaite |
| 7,599,431 | B1 | 10/2009 | Anderson et al. |
| 7,634,238 | B2 | 12/2009 | Suzuki et al. |
| 7,796,960 | B1 | 9/2010 | Rashev et al. |
| 7,904,033 | B1 | 3/2011 | Wright et al. |
| 8,185,066 | B2 * | 5/2012 | Camp, Jr. ............. H03F 1/0222 330/149 |
| 8,306,149 | B2 | 11/2012 | Mujica et al. |
| 8,391,809 | B1 | 3/2013 | Fuller |
| 8,411,730 | B2 | 4/2013 | Maeda |
| 8,446,979 | B1 | 5/2013 | Yee |
| 8,498,590 | B1 | 7/2013 | Rashev et al. |
| 8,519,789 | B2 | 8/2013 | Hawkes |
| 8,576,941 | B2 | 11/2013 | Bai |
| 8,644,437 | B2 | 2/2014 | Kim et al. |
| 8,666,336 | B1 | 3/2014 | Dick |
| 8,711,976 | B2 | 4/2014 | Chandrasekaran |
| 8,731,005 | B2 | 5/2014 | Schlee |
| 8,731,105 | B2 | 5/2014 | Bai |
| 9,071,207 | B2 | 6/2015 | Bai |
| 9,130,628 | B1 | 9/2015 | Mittal et al. |
| 9,173,173 | B2 | 10/2015 | Wei et al. |
| 9,184,710 | B2 | 11/2015 | Braithwaite |
| 9,226,189 | B1 | 12/2015 | Kularatna et al. |
| 9,252,712 | B2 | 2/2016 | Li et al. |
| 9,331,882 | B2 | 5/2016 | Fehri et al. |
| 9,337,782 | B1 | 5/2016 | Mauer et al. |
| 9,564,876 | B2 | 2/2017 | Kim et al. |
| 9,590,668 | B1 | 3/2017 | Kim et al. |
| 9,595,920 | B2 | 3/2017 | Li et al. |
| 9,614,557 | B1 | 4/2017 | Mayer et al. |
| 9,621,236 | B2 | 4/2017 | Ghannouchi et al. |
| 9,628,119 | B2 | 4/2017 | Gal et al. |
| 9,722,646 | B1 | 8/2017 | Matthews et al. |
| 9,749,161 | B1 | 8/2017 | Gal et al. |
| 9,935,810 | B1 | 4/2018 | Hammler et al. |
| 9,973,370 | B1 | 5/2018 | Langer et al. |
| 10,033,413 | B2 | 7/2018 | Pratt |
| 10,033,414 | B2 | 7/2018 | Ota |
| 10,079,699 | B1 | 9/2018 | Li et al. |
| 10,080,178 | B2 | 9/2018 | Stapleton et al. |
| 10,141,896 | B2 | 11/2018 | Huang |
| 10,141,961 | B1 | 11/2018 | Huang et al. |
| 10,181,914 | B2 | 1/2019 | Li et al. |
| 10,404,296 | B2 | 9/2019 | Kim et al. |
| 10,447,511 | B2 | 10/2019 | Xie et al. |
| 10,469,109 | B2 | 11/2019 | Gutman et al. |
| 10,523,159 | B2 | 12/2019 | Megretski et al. |
| 10,581,470 | B2 | 3/2020 | Megretski et al. |
| 10,644,657 | B1 | 5/2020 | Megretski et al. |
| 2001/0050592 | A1 | 12/2001 | Wright et al. |
| 2002/0080891 | A1 | 6/2002 | Ahn et al. |
| 2003/0058960 | A1 | 3/2003 | Lee |
| 2003/0184374 | A1 | 10/2003 | Huang et al. |
| 2003/0207680 | A1 | 11/2003 | Yang et al. |
| 2004/0076247 | A1 | 4/2004 | Barak et al. |
| 2004/0116083 | A1 | 6/2004 | Suzuki et al. |
| 2004/0121741 | A1 | 6/2004 | Rashev et al. |
| 2004/0142667 | A1 | 7/2004 | Lochhead et al. |
| 2004/0196922 | A1 | 10/2004 | Leffel |
| 2005/0001684 | A1 | 1/2005 | Braithwaite |
| 2005/0163251 | A1 | 7/2005 | McCallister |
| 2005/0163252 | A1 | 7/2005 | McCallister et al. |
| 2005/0180527 | A1 | 8/2005 | Suzuki et al. |
| 2005/0190857 | A1 | 9/2005 | Braithwaite |
| 2006/0022751 | A1 | 2/2006 | Fuller et al. |
| 2006/0154622 | A1 | 7/2006 | Piirainen |
| 2006/0229036 | A1 | 10/2006 | Muller et al. |
| 2006/0276147 | A1 | 12/2006 | Suzuki |
| 2007/0091992 | A1 | 4/2007 | Dowling |
| 2007/0230557 | A1 | 10/2007 | Balasubramonian et al. |
| 2007/0241812 | A1 | 10/2007 | Yang et al. |
| 2008/0003945 | A1 | 1/2008 | Wenham |
| 2008/0019453 | A1 | 1/2008 | Zhao et al. |
| 2008/0039045 | A1 | 2/2008 | Filipovic et al. |
| 2008/0057882 | A1 | 3/2008 | Singerl |
| 2008/0101502 | A1 | 5/2008 | Navidpour et al. |
| 2008/0247487 | A1 | 10/2008 | Cai et al. |
| 2008/0260066 | A1 | 10/2008 | Cai et al. |
| 2008/0268795 | A1 | 10/2008 | Saed |
| 2008/0285640 | A1 | 11/2008 | McCallister |
| 2009/0201084 | A1 | 8/2009 | See et al. |
| 2010/0026354 | A1 | 2/2010 | Utsunomiya et al. |
| 2010/0048149 | A1 | 2/2010 | Tang et al. |
| 2010/0225390 | A1 | 9/2010 | Brown et al. |
| 2010/0297966 | A1 | 11/2010 | Row et al. |
| 2011/0044158 | A1 | 2/2011 | Tao et al. |
| 2011/0085490 | A1 | 4/2011 | Schlee |
| 2011/0098011 | A1 | 4/2011 | Camp, Jr. et al. |
| 2011/0128992 | A1 | 6/2011 | Maeda et al. |
| 2011/0135035 | A1 | 6/2011 | Bose et al. |
| 2011/0150130 | A1 | 6/2011 | Kenington |
| 2011/0163806 | A1 | 7/2011 | Hongo |
| 2011/0187437 | A1 | 8/2011 | Perreault et al. |
| 2011/0235734 | A1 | 9/2011 | Kenington |
| 2011/0255627 | A1 | 10/2011 | Gotman et al. |
| 2011/0273234 | A1 | 11/2011 | Van der Heijen et al. |
| 2011/0273236 | A1 | 11/2011 | Heijden et al. |
| 2012/0093210 | A1 | 4/2012 | Schmidt et al. |
| 2012/0108189 | A1 | 5/2012 | McCallister et al. |
| 2012/0119810 | A1 | 5/2012 | Bai |
| 2012/0119811 | A1 | 5/2012 | Bai et al. |
| 2012/0119831 | A1 | 5/2012 | Bai |
| 2012/0154033 | A1 | 6/2012 | Lozhkin |
| 2012/0154430 | A1 | 6/2012 | Matsushima et al. |
| 2012/0176195 | A1 | 7/2012 | Dawson et al. |
| 2012/0200355 | A1 | 8/2012 | Braithwaite |
| 2012/0219048 | A1 | 8/2012 | Camuffo et al. |
| 2012/0286865 | A1 | 11/2012 | Chandrasekaran |
| 2012/0286985 | A1 | 11/2012 | Chandrasekaran et al. |
| 2012/0293252 | A1 | 11/2012 | Sorrells et al. |
| 2012/0295558 | A1 | 11/2012 | Wang et al. |
| 2013/0033317 | A1 | 2/2013 | Hawkes |
| 2013/0034188 | A1 | 2/2013 | Rashev et al. |
| 2013/0044791 | A1 | 2/2013 | Rimini et al. |
| 2013/0064325 | A1 | 3/2013 | Kilambi et al. |
| 2013/0094610 | A1 | 4/2013 | Ghannouchi et al. |
| 2013/0094612 | A1 | 4/2013 | Kim et al. |
| 2013/0163512 | A1 | 6/2013 | Rexberg et al. |
| 2013/0243121 | A1 | 9/2013 | Bai |
| 2013/0251065 | A1 | 9/2013 | Bai |
| 2013/0259159 | A1 | 10/2013 | McCallister et al. |
| 2013/0329833 | A1 | 12/2013 | Bai |
| 2014/0009225 | A1 | 1/2014 | Laporte |
| 2014/0038659 | A1 | 2/2014 | Wei et al. |
| 2014/0161159 | A1 | 6/2014 | Black et al. |
| 2014/0161207 | A1 | 6/2014 | Teterwak |
| 2014/0177695 | A1 | 6/2014 | Cha et al. |
| 2014/0187182 | A1 | 7/2014 | Yan et al. |
| 2014/0254716 | A1 | 9/2014 | Zhou et al. |
| 2014/0274105 | A1 | 9/2014 | Wang |

(56) References Cited

U.S. PATENT DOCUMENTS

| | | |
|---|---|---|
| 2014/0292579 A1 | 10/2014 | Oh et al. |
| 2014/0347126 A1 | 11/2014 | Laporte et al. |
| 2015/0043313 A1 | 2/2015 | Stranczl et al. |
| 2015/0043323 A1 | 2/2015 | Choi et al. |
| 2015/0043678 A1 | 2/2015 | Hammi |
| 2015/0049841 A1 | 2/2015 | Laporte et al. |
| 2015/0061761 A1 | 3/2015 | Wills et al. |
| 2015/0103952 A1 | 4/2015 | Wang et al. |
| 2015/0123735 A1 | 5/2015 | Wimpenny |
| 2015/0124907 A1 | 5/2015 | Li et al. |
| 2015/0171768 A1 | 6/2015 | Perreault |
| 2015/0325913 A1 | 11/2015 | Vagman |
| 2015/0326349 A1 | 11/2015 | Yang et al. |
| 2015/0333781 A1 | 11/2015 | Alon et al. |
| 2015/0357975 A1 | 12/2015 | Avniel et al. |
| 2015/0358039 A1 | 12/2015 | Xiong et al. |
| 2015/0381216 A1 | 12/2015 | Shor et al. |
| 2015/0381220 A1 | 12/2015 | Gal et al. |
| 2016/0013820 A1 | 1/2016 | Yamanouchi |
| 2016/0028433 A1 | 1/2016 | Ding et al. |
| 2016/0065147 A1 | 3/2016 | Pratt et al. |
| 2016/0087604 A1 | 3/2016 | Kim et al. |
| 2016/0094253 A1 | 3/2016 | Weber et al. |
| 2016/0095110 A1 | 3/2016 | Li et al. |
| 2016/0100180 A1 | 4/2016 | Oh |
| 2016/0112222 A1 | 4/2016 | Pashay-Kojouri et al. |
| 2016/0174118 A1 | 6/2016 | Duan et al. |
| 2016/0191020 A1 | 6/2016 | Velazquez |
| 2016/0211577 A1 | 7/2016 | Miller et al. |
| 2016/0241277 A1 | 8/2016 | Rexberg et al. |
| 2016/0249300 A1 | 8/2016 | Tsai et al. |
| 2016/0285485 A1 | 9/2016 | Fehri et al. |
| 2016/0308577 A1 | 10/2016 | Molina et al. |
| 2016/0336906 A1 | 11/2016 | Lee et al. |
| 2016/0373072 A1 | 12/2016 | Magesacher et al. |
| 2017/0005627 A1 | 1/2017 | Zhao et al. |
| 2017/0033969 A1 | 2/2017 | Yang et al. |
| 2017/0041124 A1 | 2/2017 | Khandani |
| 2017/0047899 A1 | 2/2017 | Abdelrahman et al. |
| 2017/0077981 A1 | 3/2017 | Tobisu et al. |
| 2017/0176507 A1 | 6/2017 | O'Keeffe et al. |
| 2017/0214438 A1 | 7/2017 | Ghannouchi et al. |
| 2017/0237455 A1 | 8/2017 | Ye et al. |
| 2017/0244582 A1 | 8/2017 | Gal et al. |
| 2017/0302233 A1 | 10/2017 | Huang |
| 2017/0338841 A1 | 11/2017 | Pratt |
| 2018/0097530 A1 | 4/2018 | Yang et al. |
| 2018/0159568 A1 | 6/2018 | Matsuura et al. |
| 2018/0167092 A1 | 6/2018 | Hausmair et al. |
| 2018/0287569 A1 | 10/2018 | Xu et al. |
| 2018/0337700 A1 | 11/2018 | Huang et al. |
| 2019/0007075 A1 | 1/2019 | Kim et al. |
| 2019/0104000 A1 | 4/2019 | Xie et al. |
| 2019/0238204 A1 | 8/2019 | Kim et al. |
| 2019/0260401 A1 | 8/2019 | Megretski et al. |
| 2019/0260402 A1 | 8/2019 | Chuang et al. |
| 2019/0348956 A1 | 11/2019 | Megretski et al. |
| 2019/0363676 A1 | 11/2019 | Megretski et al. |
| 2019/0363742 A1 | 11/2019 | Megretski et al. |
| 2020/0028476 A1 | 1/2020 | Kim et al. |
| 2020/0067543 A1 | 2/2020 | Kim et al. |

FOREIGN PATENT DOCUMENTS

| | | |
|---|---|---|
| CN | 104796170 A | 7/2015 |
| CN | 104871433 A | 8/2015 |
| CN | 105634539 A | 6/2016 |
| CN | 106464280 A | 2/2017 |
| EP | 0916967 A2 | 5/1999 |
| EP | 1560329 A1 | 8/2005 |
| EP | 1732208 A1 | 12/2006 |
| EP | 2991221 A1 | 3/2016 |
| JP | 2005-065211 A | 3/2005 |
| JP | 2010-136123 A | 6/2010 |
| JP | 2013-542696 A | 11/2013 |
| JP | 2014-533017 A | 12/2014 |
| WO | 20120154430 A1 | 11/2012 |
| WO | 2015107392 A1 | 7/2015 |
| WO | 2018156932 A1 | 8/2018 |
| WO | 2018227093 A1 | 12/2018 |
| WO | 2018227111 A1 | 12/2018 |
| WO | 2019/014422 A1 | 1/2019 |
| WO | 2019031714 A1 | 2/2019 |
| WO | 2019070573 A1 | 4/2019 |
| WO | 2019094713 A1 | 5/2019 |
| WO | 2019094720 A1 | 5/2019 |

OTHER PUBLICATIONS

Barrages, et al. "Polynomials and LUTs in PA Behavioral Modeling: A Fair Theoretical Comparison", IEEE Transactions on Microwave Theory and Techniques; vol. 62, No. 12, Dec. 2014, pp. 3274-3285.

Bosch et al. "Measurement and Simulation of Memory Effects in Predistortion Linearizers," IEEE Transactions on Mircrowave Theory and Techniques; vol. 37. No. 12; Dec. 1989, pp. 1885-1890.

Braithwaite, et al. "Closed-Loop Digital Predistortion (DPD) Using an Observation Path with Limited Bandwidth" IEEE Transactions on Microwave Theory and Techniques; vol. 63, No. 2; Feb. 2015, pp. 726-736.

Cavers, "Amplifier Linearization Using a Digital Predistorter with Fast Adaption and Low Memory Requirements;" IEEE Transactions on Vehicular Technology; vol. 39; No. 4; Nov. 1990, pp. 374-382.

D'Andrea et al., "Nonlinear Predistortion of OFDM Signals over Frequency-Selective Fading Channels," IEEE Transactions on Communications; vol. 49; No. 5, May 2001; pp. 837-843.

Guan, et al. "Optimized Low-Complexity Implementation of Least Squares Based Model Extraction of Digital Predistortion of RF Power Amplifiers", IEEE Transactions on Microwave Theory and Techniques; vol. 60, No. 3, Mar. 2012; pp. 594-603.

Henrie, et al., "Cancellation of Passive Intermodulation Distortion in Microwave Networks", Proceedings of the 38.sup.th European Microwave Conference, Oct. 2008, Amsterdam, The Netherlands, pp. 1153-1156.

Hong et al., "Weighted Polynomial Digital Predistortion for Low Memory Effect Doherty Power Amplifier," IEEE Transactions on Microwave Theory and Techniques; vol. 55; No. 5, May 2007, pp. 925-931.

Kwan, et al., "Concurrent Multi-Band Envelope Modulated Power Amplifier Linearized Using Extended Phase-Aligned DPD", IEEE Transactions on Microwave Theory and Techniques; vol. 62, No. 12, Dec. 2014, pp. 3298-3308.

Lajoinie et al. Efficient Simulation of NPR for the Optimum Design of Satellite Transponders SSPAs, EEE MIT-S International; vol. 2; Jun. 1998; pp. 741-744.

Li et al. "High-Throughput Signal Component Separator for Asymmetric Multi-Level Outphasing Power Amplifiers," IEEE Journal of Solid-State Circuits; vol. 48; No. 2; Feb. 2013; pp. 369-380.

Liang, et al. "A Quadratic-Interpolated Lut-Based Digital Predistortion Techniques for Cellular Power Amplifiers", IEEE Transactions on Circuits and Systems; II: Express Briefs, vol. 61, No. 3, Mar. 2014; pp. 133-137.

Liu, et al. "Digital Predistortion for Concurrent Dual-Band Transmitters Using 2-D Modified Memory Polynomials", IEEE Transactions on Microwave Theory and Techniques, vol. 61, No. 1, Jan. 2013, pp. 281-290.

Molina, et al. "Digital Predistortion Using Lookup Tables with Linear Interpolation and Extrapolation: Direct Least Squares Coefficient Adaptation", IEEE Transactions on Microwave Theory and Techniques, vol. 65, No. 3, Mar. 2017; pp. 980-987.

Morgan, et al. "A Generalized Memory Polynomial Model for Digital Predistortion of RF Power Amplifiers," IEEE Transactions of Signal Processing; vol. 54; No. 10; Oct. 2006; pp. 3852-3860.

Muta et al., "Adaptive predistortion linearization based on orthogonal polynomial expansion for nonlinear power amplifiers in OFDM systems", Communications and Signal Processing (ICCP), International Conference on, IEEE, pp. 512-516, 2011.

Naraharisetti, et a., "2D Cubic Spline Implementation for Concurrent Dual-Band System", IEEE, 2013, pp. 1-4.

(56) References Cited

OTHER PUBLICATIONS

Naraharisetti, et al. "Efficient Least-Squares 2-D-Cubic Spline for Concurrent Dual-Band Systems", IEEE Transactions on Microwave Theory and Techniques, vol. 63; No. 7, Jul. 2015; pp. 2199-2210.
Panigada, et al. "A 130 mW 100 Ms/s Pipelined ADC with 69 SNDR Enabled by Digital Harmonic Distortion Correction," IEEE Journal of Solid-State Circuits; vol. 44; No. 12; Dec. 2009, pp. 3314-3328.
Peng, et al. "Digital Predistortion for Power Amplifier Based on Sparse Bayesian Learning", IEEE Transactions on Circuits and Systems, II: Express Briefs; 2015, pp. 1-5.
Quindroit et al. "FPGA Implementation of Orthogonal 2D Digital Predistortion System for Concurrent Dual-Band Power Amplifiers Based on Time-Division Multiplexing", IEEE Transactions on Microwave Theory and Techniques; vol. 61; No. 12, Dec. 2013, pp. 4591-4599.
Rawat, et al. "Adaptive Digital Predistortion of Wireless Power Amplifiers/Transmitters Using Dynamic Real-Valued Focused Time-Delay Line Neural Networks", IEEE Transactions on Microwave Theory and Techniques; vol. 58, No. 1; Jan. 2010; pp. 95-104.
Safari, et al. "Spline-Based Model for Digital Predistortion of Wide-Band Signals for High Power Amplifier Linearization", IEEE; 2007, pp. 1441-1444.
Sevic, et al. "A Novel Envelope-Termination Load-Pull Method of ACPR Optimization of RF/Microwave Power Amplifiers," IEEE MTT-S International; vol. 2, Jun. 1998; pp. 723-726.
Tai, "Efficient Watt-Level Power Amplifiers in Deeply Scaled CMOS, " Ph.D. Dissertation; Carnegie Mellon University; May 2011; 129 pages.
Tehran, et al. "Modeling of Long Term Memory Effects in RF Power Amplifiers with Dynamic Parameters", IEEE; 2012, pp. 1-3.
Yu et al. "A Generalized Model Based on Canonical Piecewise Linear Functions for Digital Predistortion", Proceedings of the Asia-Pacific Microwave Conference; 2016, pp. 1-4.
Yu, et al. "Band-Limited Volterra Series-Based Digital Predistortion for Wideband RF Power Amplifiers," IEEE Transactions of Microwave Theory and Techniques; vol. 60; No. 12; Dec. 2012, pp. 4198-4208.
Yu, et al. "Digital Predistortion Using Adaptive Basis Functions", IEEE Transations on Circuits and Systems—I. Regular Papers; vol. 60, No. 12; Dec. 2013, pp. 3317-3327.
Zhang et al. "Linearity Performance of Outphasing Power Amplifier Systems," Design of Linear Outphasing Power Amplifiers; Google e-book; 2003; Retrieved on Jun. 13, 2014; Retrieved from Internet <URL:http:www.artechhouse.com/uploads/public/documents/chapters/Zhang-LarsonCH- 2.pdf; pp. 35-85.
Zhu et al. "Digital Predistortion for Envelope-Tracking Power Amplifiers Using Decomposed Piecewise Volterra Sereis," IEEE Transactions on Microwave Theory and Techniques; vol. 56; No. 10; Oct. 2008; pp. 2237-2247.
Cidronali, A., I. Magrini, R. Fagotti, and G. Manes. "A new approach for concurrent dual-band IF digital predistortion: System design and analysis." In 2008 Workshop on Integrated Nonlinear Microwave and Millimetre-Wave Circuits, pp. 127-130. IEEE, 2008.
Henrie, Justin, Andrew Christianson, and William J. Chappell. "Cancellation of passive intermodulation distortion in microwave networks." In Microwave Conference, 2008. EuMC 2008. 38th European, pp. 1153-1156. IEEE, 2008.
Riihonen et al., "Mitigation of Loopback Self-Interference in Full-Duplex Mimo Relays" IEEE Transactions on Signal Processing, 59(12), 5983-5993, Dec. 2011.
Cheng, Sheng-Lung, Wen-Rong Wu, Chun-Hsien Peng, Chen-Jui Hsu, and Paul Liang. "Digital predistortion for concurrent dual-band transmitter using a 2D LUT based method." In 2015 IEEE 16th Annual Wireless and Microwave Technology Conference (WAMICON), pp. 1-4. IEEE, 2015.

\* cited by examiner

LINEARIZATION WITH ENVELOPE TRACKING OR AVERAGE POWER TRACKING

CROSS-REFERENCE TO RELATED APPLICATIONS

This application claims the benefit of U.S. Provisional Application No. 62/676,613, filed May 25, 2018, the contents of which are incorporated by reference.

BACKGROUND

The present disclosure relates to digital predistortion using envelope tracking to modulate power to a transmit chain.

Power amplifiers, especially those used to transmit radio frequency communications, generally have nonlinear characteristics. For example, as a power amplifier's output power approaches its maximum rated output, nonlinear distortion of the output occurs. One way of compensating for the nonlinear characteristics of power amplifiers is to 'predistort' an input signal (e.g., by adding an 'inverse distortion' to the input signal) to negate the nonlinearity of the power amplifier before providing the input signal to the power amplifier. The resulting output of the power amplifier is a linear amplification of the input signal with reduced nonlinear distortion. Digital predistorted power amplifiers are relatively inexpensive and power efficient. These properties make digital predistorted power amplifiers attractive for use in telecommunication systems where amplifiers are required to inexpensively, efficiently, and accurately reproduce the signal present at their input.

In a typical RF power amplifier implementation with fixed supply voltage, a lot of energy is dissipated as heat. Techniques such as Envelope Tracking and Average Power Tracking can be used, in some conventional implementations, to dynamically adjust the supply voltage to reduce wasted energy, and hence improve system power efficiency. In such conventional tracking implementations, a shaping table may be used to translates envelope amplitude into PA supply voltage (thus reducing the power used to operate the RF power amplifier based on the changing behavior of the signals amplified). An aggressive shaping table yields higher efficiency at the cost of damaged PA linearity. On the other hand, a conservative shaping table yields higher PA linearity, but at the cost of power efficiency.

SUMMARY

In one or more implementations, an efficient arrangement of a linearization system is realized in which a power amplifier of a transmit chain is intentionally operated in non-linear mode (for example, by underpowering the power amplifier of the transmit chain being used). The non-linear effects of the intentional non-linear operation of the transmit chain are mitigated through dynamic (adaptable) predistortion operation that factor in the intentional non-linear operation of the transmit chain. That is, the predistortion functions are based not only the input signal that is to be predistorted, but also on the control signal used to modulate the power amplifier (i.e., to control the power provided to operate the power amplifier) to intentionally/deliberately put the power amplifier (and thus the transmit chain) into non-linear operational mode. In the present disclosure, the control signal based on which predistortion is performed is an envelope tracking signal (to track the input signal being predistorted) that is optimized according to constraints that factor in characteristics of the transmit chain (and thus implicitly take into account the non-linear vs. linear behavioral characteristics of the transmit chain). A control signal (or some resulting signal derived therefrom) used to modulate the power provided to the power amplifier may also be provided to an estimator/adaptor module that optimizes predistortion coefficients that are used to derive the predistorted signal provided as input to the transmit chain (in order generate a transmit chain output in which the non-linear effects have been substantially removed).

Accordingly, in some embodiments, the control signal (e.g., an envelope tracking signal, or some signal derived from that envelope tracking signal) may be used both as one or more of: i) input to a predistorter that operates jointly on that control signal and on a base band input signal that is to be linearized (i.e., the predistorted signal provided to the transmit chain is a function of both the control signal and the base band signal), ii) input to an estimator/adaptor module so that the control signal (or a signal derived from the control signal) can be used to determine optimized predistortion coefficients that mitigate the non-linear effects of the transmit chain that is intentionally operated in non-linear mode, and/or iii) input to a power supply modulator (that regulates the power provided to a power amplifier, and thus can regular the non-linear behavior of the power amplifier). By using a control signal (e.g., an envelope tracking signal used to control the power supply modulator of a transmit chain's power amplifier) as one of the inputs to the predistorter and/or using the control signal (or a signal derived therefrom) to optimize the predistortion coefficients, the linearization system can operate at high efficiency. Particularly, in such implementations, less power is needed to obtain high performance for the transmit chain, e.g., the power amplifier can be underpowered, while still allowing the resultant output of the transmit chain to be substantially free of non-linear effects. Additionally, by controllably underpowering the power amplifier in the manner described herein, the longevity of electronic components used by the circuitry of the system (which may be part of a digital front end of a wireless device or system) can be extended.

Thus, in a general aspect, a linearization system is disclosed that includes an envelope tracker to generate a slow or fast envelope signal to dynamically control the non-linear behavior of the power amplifier (PA) and help improve power efficiency to operate the PA. The linearization system further includes a digital predistorter (DPD, also referred to as adapter block) which applies weighed basis functions to an input signal (and optionally to the envelope tracking signal) to generate a predistorted signal provided to the transmit chain. As a result, the predistortion functionality can depend on the envelope tracking output, and thus the extent of the non-linear behavior of the RF power amplifier can be more optimally controlled. For example, instead of controlling the operational power of the PA to improve the linearity of the PA, the PA can be configured to operate in a controlled non-linear mode that can be mitigated through controlled predistortion of the input signal, u. Accordingly, the implementations described herein allow for optimization of the shaping table behavior (controlling power operation of the PA) for a given PA set-up and performance target.

Accordingly, in some variations, a method for digital predistortion is provided that includes receiving, by a digital predistorter, a first signal that depends on amplitude variations based on an input signal, u, with the variations of the first signal corresponding to time variations in non-linear characteristics of a transmit chain that includes a power amplifier. The method further includes receiving, by the digital predistorter, the input signal u, generating, by the digital predistorter, based at least in part on signals comprising the input signal u and the first signal, a digitally predistorted signal v to mitigate the non-linear behavior of the transmit chain, and providing the predistorted signal v to the transmit chain.

Embodiments of the method may include at least some of the features described in the present disclosure, including one or more of the following features.

Receiving by the digital predistorter the first signal may include monitoring by the digital predistorter a time-varying signal e generated by an envelope tracker that received a copy of the input signal u.

The method may further include computing samples of the digitally predistorted signal, v, provided to the transmit chain, as a non-linear function of samples of the input signal u and the first signal.

The time-varying signal e may be generated from the input signal u such that the time-varying signal e causes at least some non-linear behavior of the power amplifier. Generating the digitally predistorted signal v may include using the time-varying signal e to digitally predistort the input signal u such that the output of the transmit chain resulting from digitally predistorting the input signal u is substantially free of the at least some non-linear distortion caused by the time-varying signal e.

The time-varying signal e may be generated to satisfy a set of constrains, including a first constraint in which e[t] ≥h(|u[t]|), where h(.) defines a relation between instantaneous power of the input signal u and a power supply of the transmit chain, a second constraint imposing maximal value and curvature bounds for the signal e[t], such that e[t]≤E0, and |2e[t]−e[t−1]−e[t+1]|≤E2, where E0 and E2 are values representative of operational characteristics of the transmit chain, and a third constraint requiring that values of e[t] be as small as possible, subject to the first and second constraints.

Generating the digitally predistorted signal v based on the signals comprising the input signal u and the first signal, may include generating the digitally predistorted signal v based, at least in part, on the input signal u and the time-varying signal e to produce the digitally predistorted signal v according to:

$$v[t] = u[t] + \sum_{k=1}^{n} x_k B_k(q_u[t], q_e[t])$$

with $$q_u[t] = \begin{bmatrix} u[t+l-1] \\ u[t+l-2] \\ \vdots \\ u[t+l-\tau] \end{bmatrix}$$

and with $$q_e[t] = \begin{bmatrix} e[t+s(l-1)] \\ e[t+s(l-2)] \\ \vdots \\ e[t+s(l-\tau)] \end{bmatrix}$$

with $B_k$ being basis functions, $q_u[t]$ and $q_e[t]$ being stacks of recent baseband and envelope input samples, respectively, s being a time scale separation factor representative of a ratio of time constants of the power amplifier and a modulator powering the power amplifier, and $x_k$ being computed coefficients to weigh the basis functions.

The method may further include computing according to an optimization process based, at least in part, on observed samples of the transmit chain, the computed coefficients $x_k$ to weigh the basis functions $B_k$.

The method may further include generating, based on received the time-varying signal e, a resultant time-varying signal, $e_A$, through digital predistortion performed on the signals comprising the input signal u and the time-varying signal e, to mitigate non-linear behavior of a power supply modulator producing output to modulate, based on the resultant time-varying signal $e_A$, the power provided to the power amplifier of the transmit chain, with $e_A$ having a lower bandwidth than the time-varying signal e.

The method may further include down-sampling the resultant time-varying signal, $e_A$, provided to the power supply modulator producing the output to modulate, based on the resultant down-sampled time-varying signal, $e_A$, the power provided to the power amplifier of the transmit chain.

The method may further include filtering the time-varying signal e.

In some variations, a digital predistorter is provided that includes a receiver section to receive an input signal, u, and a first signal that depends on amplitude variations based on the input signal, u, with the variations of the first signal correspond to time variations in non-linear characteristics of a transmit chain comprising a power amplifier. The digital predistorter further includes a controller to generate, based at least in part on signals comprising the input signal u and the first signal, a digitally predistorted signal v to mitigate the non-linear behavior of the transmit chain, and an output section to provide the predistorted signal v to the transmit chain.

Embodiments of the digital predistorter may include at least some of the features described in the present disclosure, including any of the above method features.

In some variations, an additional method for digital predistortion is provided that includes receiving by an envelope tracking module an input signal u, the input signal u further provided to a digital predistorter coupled to a transmit chain comprising a power amplifier, and determining, by the envelope tracking module, based on amplitude variations of the input signal u, a time-varying signal, e, with the amplitude variations of the time-varying signal e corresponding to time variations in non-linear characteristics of the transmit chain. The method further includes outputting, by the envelope tracking module, the time-varying signal e, with the digital predistorter being configured to receive another input signal that depends on the amplitude variations of the time-varying signal e, and to generate, based at least in part on signals comprising the input signal u and the other input signal, a digitally predistorted output, v, provided to the transmit chain, to mitigate non-linear behavior of the transmit chain.

Embodiments of the additional method may include at least some of the features described in the present disclosure, including any of the above features of the first method and digital predistorter, as well as one or more of the following features.

Determining the time-varying signal, e, may include determining the time-varying signal e to cause a power supply modulator controlling the electrical operation of the transit chain to underpower the power amplifier so as to cause the transmit chain to operate in a non-linear mode.

Determining the time-varying signal, e, may include deriving the time-varying signal, e, according to one or more constraints representative of characteristics of the transmit chain.

Deriving the time-varying signal e may include deriving the time-varying signal e satisfying a set of constraints that includes a first constraint in which e[t]≥h(|u[t]|), where h(.) defines a relation between instantaneous power of the input signal u and a power supply of the transmit chain, a second constraint imposing maximal value and curvature bounds for the signal e such that e[t]≤E0, and |2e[t]−e[t−1]−e[t+1]|≤E2, where E0 and E2 are values representative of operational characteristics of the power amplifier, and a third constraint requiring that values of e[t] be as small as possible, subject to the first and second constraints.

E2 may be representative of one or more of, for example, a bandwidth of the transmit chain, and/or a response speed of the transmit chain to variations in amplitude of the input signal u.

The method may further include providing, by the envelope tracking module, the time-varying signal e to the digital predistorter, with the other input signal of the digital predistorter being the time varying signal e.

Providing the time-varying signal may include providing the time-varying signal e to the digital predistorter to produce a resultant control signal, $e_A$, provided to a power supply modulator controlling the electrical operation of the transit chain.

The digital predistorter configured to produce the resultant control signal $e_A$ may be configured to compute, based, at least in part, on observed samples of the transmit chain, coefficients to weigh basis functions applied to samples of the input signal u and the time-varying signal e to generate the resultant control signal $e_A$.

The digital predistorter configured to generate the digitally predistorted output, v, may be configured to generate the digitally predistorted output, v, based on the input signal u and the time-varying signal, e, according to:

$$v[t] = u[t] + \sum_{k=1}^{n} x_k B_k(q_u[t], q_e[t])$$

with $$q_u[t] = \begin{bmatrix} u[t+l-1] \\ u[t+l-2] \\ \vdots \\ u[t+l-\tau] \end{bmatrix}$$

and with $$q_e[t] = \begin{bmatrix} e[t+s(l-1)] \\ e[t+s(l-2)] \\ \vdots \\ e[t+s(l-\tau)] \end{bmatrix}$$

with $B_k$ being basis functions, $q_u[t]$ and $q_e[t]$ being stacks of recent baseband and envelope input samples, respectively, s being a time scale separation factor representative of a ratio of time constants of the power amplifier and the power supply modulator powering the power amplifier, and $x_k$ being computed coefficients to weigh the basis functions.

The coefficients $x_k$ may be computed according to an optimization process based, at least in part, on observed samples of the transmit chain.

In some variations, an envelope tracking module is provided that includes a receiver to receive an input signal u, the input signal u further provided to a digital predistorter coupled to a transmit chain comprising a power amplifier. The envelope tracking module further includes and a controller to determine, based on amplitude variations of the input signal u, a time-varying signal, e, with the amplitude variations of the time-varying signal e corresponding to time variations in non-linear characteristics of the transmit chain. The envelope tracking module additionally includes an output section to output the time-varying signal e, with the digital predistorter being configured to receive another input signal that depends on the amplitude variations of the time-varying signal e, and to generate, based at least in part on signals comprising the input signal u and the other input signal, a digitally predistorted output, v, provided to the transmit chain, to mitigate non-linear behavior of the transmit chain.

Embodiments of the envelope tracking module may include at least some of the features described in the present disclosure, including any of the above features for the various methods and for the digital predistorter.

In some variations, a further method is provided that includes receiving, by a power supply modulator, one or more control signals, and regulating, based on the one or more control signals, power supply provided to a power amplifier of a transmit chain to underpower the power amplifier so that the transmit chain includes at least some non-linear behavior. The at least some non-linear behavior of the transmit chain, resulting from regulating the power supply based on the one or more control signals, is at least partly mitigated through digital predistortion performed by a digital predistorter on signals comprising an input signal, u, provided to the digital predistorter, and on another signal, provided to the digital predistorter, that depends on amplitude variations based on the input signal, u, with the variations of the other signal corresponding to time variations in non-linear characteristics of the transmit chain.

Embodiments of the further method may include at least some of the features described in the present disclosure, including any of the above features of the first and second methods, the digital predistorter, and the envelope tracking module, as well as one or more of the following features.

The other signal provided to the digital predistorter includes a time-varying signal e generated by an envelope tracker that receives a copy of the input signal u.

The time-varying control signal e may be derived based on a set of constraints, including a first constraint in which e[t]≥h(|u[t]|), where h(.) defines a relation between instantaneous power of the input signal u and a power supply of the transmit chain, a second constraint imposing maximal value and curvature bounds for the signal e, such that e[t]≤E0, and |2e[t]−e[t−1]−e[t+1]|≤E2, where E0 and E2 are values representative of operational characteristics of the power amplifier, and a third constraint requiring that values of e[t] be as small as possible, subject to the first and second constraints.

E2 may be representative of one or more of, for example, a bandwidth of the transmit chain, and/or a response speed of the transmit chain to variations in amplitude of the input signal u.

Receiving the one or more control signals may include receiving a time-varying control signal, $e_A$, derived based, at least in part, on the time-varying signal e, with $e_A$ having a lower bandwidth than the time-varying signal e.

Receiving the time-varying signal $e_A$ may include receiving the time-varying signal, $e_A$, generated through digital predistortion performed on multiple signals comprising the input signal u and the time-varying signal e, to mitigate non-linear behavior of the power supply modulator producing output based on the resultant time-varying signal, $e_A$.

The digital predistorter may be configured to generate digitally predistorted output signal, v, from the multiple signals comprising the input signal u and the time-varying control signal e, according to:

$$v[t] = u[t] + \sum_{k=1}^{n} x_k B_k(q_u[t], q_e[t])$$

with $$q_u[t] = \begin{bmatrix} u[t+l-1] \\ u[t+l-2] \\ \vdots \\ u[t+l-\tau] \end{bmatrix}$$

and with $$q_e[t] = \begin{bmatrix} e[t+s(l-1)] \\ e[t+s(l-2)] \\ \vdots \\ e[t+s(l-\tau)] \end{bmatrix}$$

with $B_k$ being basis functions, $q_u[t]$ and $q_e[t]$ being stacks of recent baseband and envelope input samples, respectively, s being a time scale separation factor representative of a ratio of time constants of the power amplifier and the power supply modulator powering the power amplifier, and $x_k$ being computed coefficients to weigh the basis functions.

The coefficients $x_k$ may be computed according to an optimization process based, at least in part, on observed samples of the transmit chain.

The coefficients $x_k$ computed according to the optimization process may be computed according to the optimization process and further based on an output of the power supply modulator, the output being one of, for example, a voltage provided to the power amplifier, and/or a control signal to cause a corresponding voltage to be provided to the power amplifier.

Receiving the time-varying signal $e_A$ may include receiving the time-varying control signal, $e_A$, generated as a bandwidth lowering function of the time-varying signal e.

In some variations, a power supply modulator, to control electrical operation of a transmit chain, is provided. The power supply modulator includes a receiver to receive one or more control signals, and a regulator to regulate, based on the one or more control signals, power supply provided to a power amplifier of the transmit chain to underpower the power amplifier so that the transmit chain includes at least some non-linear behavior. The at least some non-linear behavior of the transmit chain, resulting from regulating the power supply based on the one or more control signals, is at least partly mitigated through digital predistortion performed by a digital predistorter on signals comprising an input signal, u, provided to the digital predistorter, and on another signal, provided to the digital predistorter, that depends on amplitude variations based on the input signal, u, with the variations of the other signal corresponding to time variations in non-linear characteristics of the transmit chain.

Embodiments of the power supply modulator may include at least some of the features described in the present disclosure, including any of the above features for the various methods, for the digital predistorter, and for the envelope tracking module.

In some variations, systems are provided that are configured to perform one or more of the method steps provided above.

In some variations, a design structure is provided that is encoded on a non-transitory machine-readable medium, with the design structure including elements that, when processed in a computer-aided design system, generate a machine-executable representation of one or more of the systems, digital predistorters, envelope tracking modules, power supply modulators, and/or any of their respective modules, as described herein.

In some variations, an integrated circuit definition dataset that, when processed in an integrated circuit manufacturing system, configures the integrated circuit manufacturing system to manufacture one or more of the systems, digital predistorters, envelope tracking modules, power supply modulators, and/or any of their respective modules, as described herein.

In some variations, a non-transitory computer readable media is provided that is programmed with a set of computer instructions executable on a processor that, when executed, cause the operations comprising the various method steps described above.

Other features and advantages of the invention are apparent from the following description, and from the claims.

BRIEF DESCRIPTION OF DRAWINGS

These and other aspects will now be described in detail with reference to the following drawings.

Like reference symbols in the various drawings indicate like elements.

DETAILED DESCRIPTION

Figure 1:
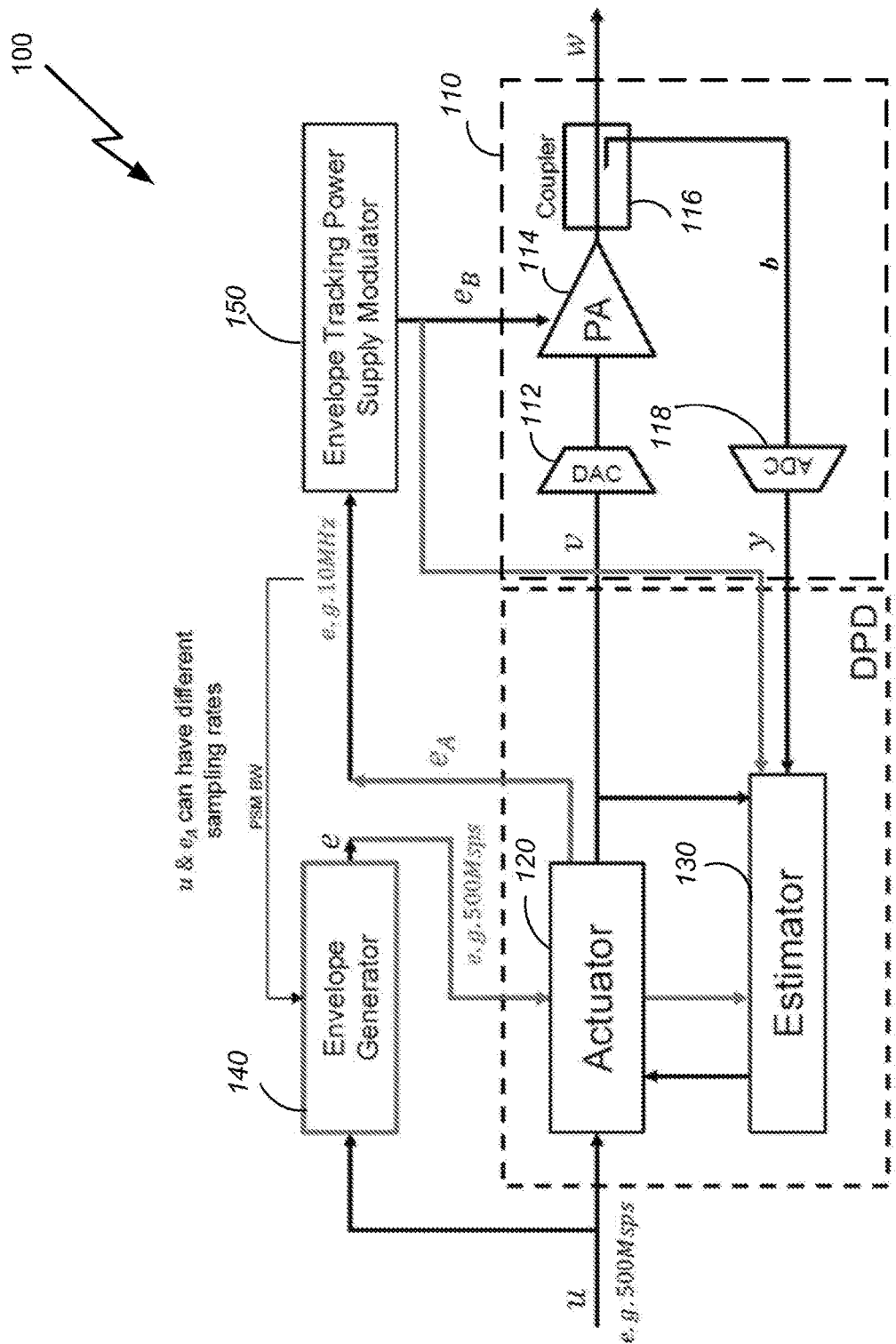
FIG. 1 is a schematic diagram of a linearization system implementation.

Described are various digital predistortion implementations that include an envelope generator that can generate a slow or fast envelope signal (depending on available bandwidth), an actuator (predistortion) block that depends on both the signal itself and the envelope to thus use the envelope signal e (in addition to u) to generate the predistorted output v provided to the transmit chain. The system is able to generate an optimal shaping table for a given PA set-up and performance targets. The envelope generator implements an advanced function to convert an input signal (e.g., baseband input), u, into a safe (e.g., from a power consumption perspective) and efficient envelope signal, e. The actuator block is configured to also generate a resultant envelope signal, $e_A$, that can be optimized to generate better linearization results with a bandwidth that is compatible with a power supply modulator of the linearization system.

Thus, in some embodiments, an example method for digital predistortion, generally performed at a digital predistorter of a linearization system, is provided. The method includes receiving (by a digital predistorter) a first signal that depends on amplitude variations based on an input signal, u, with the variations of the first signal corresponding to time variations in non-linear characteristics of a transmit chain that includes a power amplifier. The method further includes receiving (by the digital predistorter) the input signal u, generating, by the digital predistorter, based at least in part on signals comprising the input signal u and the first signal, a digitally predistorted signal v to mitigate the non-linear behavior of the transmit chain, and providing the predistorted signal v to the transmit chain. In some embodiments, the first signal may be the output of an envelope tracker, in which case receiving the first signal may include monitoring by the digital predistorter a time-varying signal e generated by an envelope tracker (the envelope tracking module which may be a separate module from the digital predistorter) that received a copy of the input signal u. In some examples, the time-varying signal e is generated from the input signal u such that the time-varying signal e causes at least some non-linear behavior of the power amplifier. In such examples, generating the digitally predistorted signal v may include using the time-varying signal e to digitally predistort the input signal u such that the output of the transmit chain resulting from digitally predistorting the input signal u is substantially free of the at least some non-linear distortion caused by the time-varying signal e.

In additional implementations described herein, an example method to control electrical operation of a transmit chain, generally performed by an envelope tracking module of a linearization system, is provided. The method includes receiving by an envelope tracking module an input signal u, with the input signal u further provided to a digital predistorter coupled to a transmit chain that includes a power amplifier. The method further includes determining, by the envelope tracking module, based on amplitude variations of the input signal u, a time-varying signal, e, with the amplitude variations of the time-varying signal e correspond to time variations in non-linear characteristics of the transmit chain, and outputting, by the envelope tracking module, the time-varying signal e. The digital predistorter is configured to receive another input signal that depends on the amplitude variations of the time-varying signal e, and to generate, based at least in part on signals comprising the input signal u and the other input signal, a digitally predistorted output, v, provided to the transmit chain, to mitigate non-linear behavior of the transmit chain. In some embodiments, the other input signal provided to the digital predistorter is the time varying signal e determined by the envelope tracking module. The digital predistorter is further configured, in such embodiments, to additionally produce a resultant control signal, $e_A$, provided to a power supply modulator controlling the electrical operation of the transit chain.

In further implementations described herein, an example method to control electrical operation of a transmit chain, generally performed at a power supply modulator of a linearization system, is provided. The method includes receiving, by a power supply modulator, one or more control signals, and regulating, based on the one or more control signals, power supply provided to a power amplifier of a transmit chain to underpower the power amplifier so that the transmit chain includes at least some non-linear behavior. The at least some non-linear behavior of the transmit chain, resulting from regulating the power supply based on the one or more control signals, is at least partly mitigated through digital predistortion performed by a digital predistorter on signals comprising an input signal, u, provided to the digital predistorter, and on another signal, provided to the digital predistorter, that depends on amplitude variations based on an input signal, u, wherein the variations of the other signal correspond to time variations in non-linear characteristics of the transmit chain. In some embodiments, the other signal provided to the digital predistorter includes a time-varying signal e generated by an envelope tracker that receives a copy of the input signal u. In some examples, the time-varying signal e is derived based on a set of constraints that includes a first constraint in which $e[t] \geq h(|u[t]|)$, where $h(.)$ defines a relation between instantaneous power of the input signal u and a power supply of the transmit chain, a second constraint imposing maximal value and curvature bounds for the signal e, such that $e[t] \leq E0$, and $|2e[t]-e[t-1]-e[t+1]| \leq E2$, where E0 and E2 are values representative of operational characteristics of the power amplifier, and a third constraint requiring that values of $e[t]$ be as small as possible, subject to the first and second constraints (it is to be noted that a similar procedure to derive e may be realized with respect to the above methods implemented for the digital predistorter and the envelope tracking module).

Thus, with reference to FIG. 1, a schematic diagram of an example linearization system 100, comprising a power amplifier 114 whose operational power (and thus non-linear behavior) is controlled based on an envelope tracking signal e produced by an envelope generator (tracker) 140, and based on the system's input signal, u, is shown. In some examples, the envelope tracker/generator 140 is configured to produce an output that takes into account non-linear behavior of various modules of the system 100 (and not only the non-linear behavior of the PA 114), including the non-linear behavior of a power supply modulator 150 that controls the power provided to the power amplifier 114. Thus, for example, the envelope tracker 140 may produce output based on the non-linear characteristics of the power supply modulator (and/or non-linear characteristics of other modules/units of the system 100) with such output either provided directly to the power supply modulator (e.g., to mitigate, in some embodiments, the non-linear behavior of the power supply modulator 150), or provided to the actuator 120 for further processing (as will be discussed in greater detail below). The linearization system 100 includes a transmitter chain 110 used to perform the transmission processing on signals produced by an actuator (implementing a digital predistorter, or DPD) 120. Particularly, in the embodiments of FIG. 1, the transmit chain includes a transmitter and observation path circuitry that includes a digital-to-analog converter 112 (which may optionally be coupled to a frequency modulator/multiplier and/or a variable gain amplifier) that produces an analog signal that possibly has been shifted to an appropriate RF band. The predistorted analog signal (also referred to as predistorted output signal) is then provided to the power amplifier 114 whose power is modulated by a signal $e_B$ (which may be the actual supplied voltage to power the PA, or a signal representative of the voltage level to be applied to the PA) determined based on an envelope tracking signal $e_A$ produced by the actuator 120 based on the input signal u. As will be discussed in greater detail below, in some embodiments, a modulation signal $e_A$ produced by the actuator 120, may take into account the behavior of the input signal u, the predistortion functionality of the actuator 120, characteristics of the power supply modulator 150 (including any non-linear characteristics of the power supply modulator), and characteristics of the PA 114 (including the PA's non-linear profile) in order to produce the modulating signal, $e_B$, to modulate the PA 114 in a more optimal way that depends not only on the signal u, but also on the desired predistortion and non-linear behaviors of the system 100. The output signal, w, produced by the PA 114, is a process (e.g., amplified) signal in which, ideally (depending on the effectiveness of the predistortion functionality implemented by the actuator 120 and the non-linear behavior of the PA regulated through the control signal $e_B$), non-linear distortion of the output signal has been substantially removed. In some embodiments, the output signal, w, may be provided to a bandpass filter (not shown in FIG. 1) to remove any unwanted harmonics or other signal noise, before being communicated to its destination (a local circuit or device, or a remote device) via a wired or wireless link. It is to be noted that to the extent that the envelope tracker/generator 140 may be configured to model the non-linear behavior of either the PA 114 and/or the power supply modulator 150, the sampling rate for the signal $e_A$ may be controlled (e.g., be increased) so that it can better track/monitor frequency expansion resulting from the non-linear behavior of power supply modulator and/or other modules of the system 100. $e_A$ may have a sampling rate of, for example, 10 msps, 100 msps, or any other appropriate sampling rate.

As also shown in FIG. 1, the transmitter chain 110 includes an observation path to measure the output signal produced by the PA 114 in order to perform the DPD adaptation process (discussed in greater detail below). In some embodiments, the observation path circuitry includes a frequency demodulator/multiplier (e.g., which may be part of a coupler 116 schematically depicted in FIG. 1) whose output is coupled to an analog-to-digital converter (ADC) 118 to produce the digital samples used in the DPD adaptation process implemented by an estimator 130. The estimator 130 is configured to, for example, compute coefficients that weigh basis functions selected to perform the predistortion operation on the input signal u. It is to be noted that while the signals u and $e_A$ can have different sampling rates, the feedback signals y and $e_B$ (i.e., the signal modulating the power level of the PA) generally need to be provided at the same sampling rate for proper basis reconstruction. The estimator 130 derives the DPD coefficients based (at least indirectly) on the amplitude variations of the input signal u (provided to the actuator 120 and the envelope tracker 140). Particularly, because the envelope tracker 140 produces a signal that corresponds to the amplitude variations of the input signal u, and that signal is used to control the non-linear behavior of the PA, which in turn impacts the output of the transmit chain, the coefficients derived by the estimator 130 are affected by the amplitude variation behavior tracked by the envelope tracker 140.

In addition to producing coefficients to weigh the predistortion components/functions, the estimator 130 may also be configured to derive coefficients that weigh functions applied to the envelope tracking signal e (in embodiments in which the signal e produced by the envelope tracker 140 is provided directly to the actuator 120, as occurs in the system 100 of FIG. 1) to produce a resultant control signal $e_A$ that controls/modulates an envelope tracking power supply modulator 150 to control or modulate power provided to operate the PA 114 of the system 100. More particularly, as noted, the envelope tracker/generator 140 is configured to generate an envelope signal e which is appropriate for the given input baseband signal u and for the power amplifier implementation in order to regulate the operation (including the non-linear behavior) of the PA. As will be discussed in greater detail below, in some embodiments, a modulation signal $e_A$, produced by the actuator 120, may take into account the behavior of the input signal u, the predistortion functionality of the actuator 120, characteristics of the power supply modulator 150 (including any non-linear characteristics of the power supply modulator), and characteristics of the PA 114 (including the PA's non-linear profile) in order to produce the modulating signal, $e_B$, to modulate the PA 114 in a more optimal way that depends not only on the signal u, but also on the desired predistortion and non-linear behaviors of the system 100.

In some embodiments, and as depicted in FIG. 1, instead of directly being supplied to the power modulator 150, the tracked envelope signal e may be directed to the actuator 120, which makes explicit use of the tracked envelope signal e to generate the predistorted signal v. In some embodiments, the signal u (or, alternatively, the intermediate signal v) may also be used to generate the new envelope signal $e_A$, with the new envelope signal $e_A$ having a bandwidth that is compatible with the power supply modulator 150. In some embodiments, the signal e may also be provided (in addition to, or instead of) to the power supply modulator 150.

Figure 2:
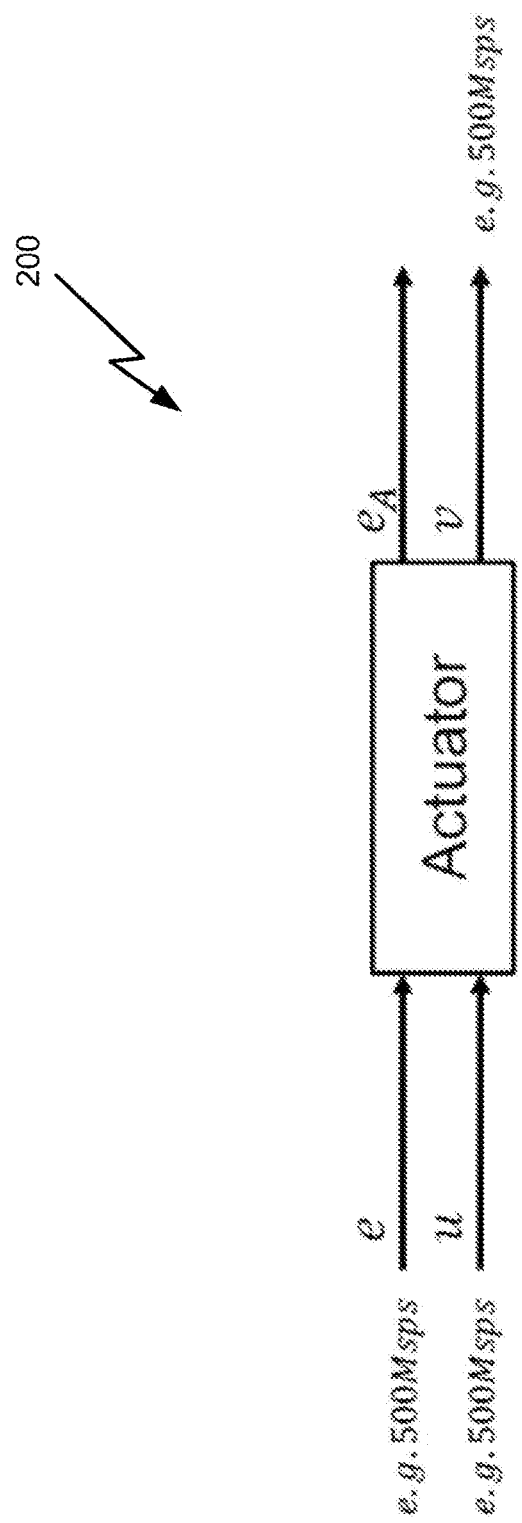
FIG. 2 is a diagram of an actuator, with an example inputs/output configuration.

Thus, as depicted in FIG. 2, showing an example of the inputs/output configuration for an example actuator 200 (which may be similar to the actuator 120 of FIG. 1), in some embodiments the actuator 200 (DPD engine) receives the input signal u (e.g., a digital signal with 500 Msps) and also receives the tracked envelope signal e generated based on the signal u (with a bandwidth commensurate with the bandwidth of the signal u, e.g., the signal e may also have 500 Msps signal). The actuator 200 predistorts the signal u to generate the predistorted signal v based, in part, on e, with the predistorted signal v having a bandwidth commensurate with the bandwidth of the input signal u (e.g., v may also be a signal with 500 Msps). The actuator also generates the signal $e_A$, optionally based, in part, on the signal u, with $e_A$ having a bandwidth that is compatible with the bandwidth of the power supply modulator 150. In the example of FIG. 2, the new tracked envelope signal generated based on the signal e (and possibly based on the signal u) has a bandwidth corresponding to 10 Msps (as compared to the much larger 500 Msmp of the predistorted signal v). It is noted that in some implementation the new signal $e_A$ need not be based on the time-varying signal u, but instead may be, for example, a down-sampled version of the signal e, or may otherwise be a resultant signal processed (through some pre-determined filtering process) from the signal e.

In embodiments where the tracked envelope signal is provided to the actuator 120, the signal e should be large enough to avoid irreversible damage to the baseband signal u caused by clipping, but should also be as small as possible to maximize PA efficiency. Accordingly, in some embodiments, the envelope tracker 140 is implemented to generate a digital envelope signal e=e[t] (for the purposes of the present description, the notation t represents discrete digital samples or instances) that satisfies three (3) main conditions. A first condition is that the inequality $e[t] \geq h(|u[t]|)$ has to be satisfied, where the function $h(.)$ defines the relation between the instantaneous power of the baseband signal and the power supply, preventing irreparable damage by clipping. This function corresponds to the shaping table used in conventional envelope trackers/generators generating envelope signals that directly regulate the power of the PA in a power amplifier system. An example of function $h(.)$ is given by:

$$h(|u|) = V\min + \frac{(V\max - V\min)|u|}{U\max}$$

where Vmin is the minimal supply voltage for the PA, Vmax is the maximal supply voltage for the PA, and Umax is the maximal possible value of |u[n]|. This constraint can be used to control the voltage range to be controlled by the envelope tracker. Other examples of functions h that establish relations between instantaneous power of a baseband signal and the power supply may be used.

A second condition or constraint that may be imposed on the signal e generated by the envelope tracker 140 is that e(t) needs to satisfy maximal value and curvature bounds, expressed by the following inequalities:

$$e[t] \leq E0, \text{ and } |2e[t]-e[t-1]-e[t+1]| \leq E2,$$

where the constants E0, E2 depend on the particular PA used (e.g., E0 and E2 represents operational characteristics, attributes, and behavior of the particular PA 114 used in the transmit chain 110 of FIG. 1). The expression $|2e[t]-e[t-1]-e[t+1]| \leq E2$ is a bounding second derivative and may represent a smoothness constraint. This constraint may be used to control the smoothness of the tracking envelope curve, and thus control the response speed of the envelope tracking to the signal being tracked (e.g., the constraint may be used to control how fast the signal response is; a smoother function, e, will correspond to a slower tracking signal). The pre-determined constant E2 can thus be selected (e.g., by a user) to control the speed of the response of the envelope tracker, and can be representative of the bandwidth characteristics of the PA 114 and/or the envelope tracking power supply modulator 150.

A third constraint that may be imposed on the signal e[t] is that, subject to the bounds established by the first and second constrains, the values of e[t] should be as small as possible.

Thus, the envelope tracker/generator is configured to implement a substantially real-time signal processing procedure which conforms to the constraints (1)-(3) by, for example, iteratively updating a function g=g(t, a) such that selecting e[t]≥g(t, e[t-1]) is not in conflict with the specifications constraints e[t]≤E0 and e[t]≥2e[t-1]-e[t-2]-E2, and allows future selections of e[τ], with τ>t, to be possible in such a way that to satisfy conditions (1) and (2). The lower bound g(t, a) is specified as a piecewise linear function of its second argument, with break points spaced evenly on the interval [0, e0].

The signal e[t] determined, based on the input signal u[t] (prior to any predistortion processing applied to u) is provided to the actuator/DPD engine 120 of the system 100 depicted in FIG. 1. As noted, the actuator 120 may generate two output signals: i) a predistorted signal v[t], which is derived based on the input signal u (which is a digital signal that can be represented as u[t]) and the time-varying envelope tracking signal e[t] (whose samples depend on the amplitude variations of the signal u[t]), and ii) the resultant envelope tracking signal $e_A[t]$ which may also be derived based on the input signal u[t] and the envelope tracking signal e[t] and therefore can factor into the modulating signal (controlling the PA) the behavior of the input signal u[t]. By basing both the resultant predistorted signal v[t] and the power supply modulation signal $e_A[t]$ on the input signal u[t] and the envelope tracking signal e[t] (with the tracking signal being derived based, in part, on the particular characteristics, as represented by the values E0 and E2, of the PA to be regulated), the PA can be carefully regulated to control its non-linear behavior in a way that would allow a more optimal processing of the predistorted signal. Put another way, higher efficiency (e.g., in terms of power consumption and bandwidth characteristics) may be achieved by deliberately setting the PA to operate in a non-linear mode (e.g., by under-powering the PA, to reduce power consumption) that is mitigated/countered through predistortion processing of the input signal u[t] that depends on the particular non-linear behavior point selected for the PA. Accordingly, in such embodiments, the actuator 120 is configured to perform the digital predistortion by using the time-varying control signal e in the digital predistortion of the input signal u such that the output of the transmit chain resulting from the input signal u and actuated by the control signal e is substantially free of the at least some non-linear distortion caused by the generated control signal.

Different predistortion processing may be implemented by the actuator 120 to pre-invert the signal. In some example embodiments, the actuator 120 may derive the output v[t] according to the expression:

$$v[t] = u[t] + \sum_{k=1}^{n} x_k B_k(q_u[t], q_e[t]) \text{ with}$$

$$q_u[t] = \begin{bmatrix} u[t+l-1] \\ u[t+l-2] \\ \vdots \\ u[t+l-\tau] \end{bmatrix} \text{ and with}$$

$$q_e[t] = \begin{bmatrix} e[t+s(l-1)] \\ e[t+s(l-2)] \\ \vdots \\ e[t+s(l-\tau)] \end{bmatrix}$$

In the above expression, $B_k$ are the basis functions, $q_u[t]$ and $q_e[t]$ are the stacks of recent (around t) baseband and envelope input samples, respectively, s is a time scale separation factor, which is a positive integer reflecting the ratio of time constants of the PA's power modulator and the PA, and $x_k$ are complex scalars of the coefficients of the compensator $x \in \mathbb{C}^n$. The estimator 130 (i.e., adaptation unit) illustrated in FIG. 1 adjusts the coefficients $x_k$ of the actuator by observing the measurement samples y[t] (observed from the output signal w(t) of the PA 114) and may minimize the regularized mean squared error. This can be solved, for example, by any minimization technique such as a least-squares method, a stochastic gradient method, etc. The optimization of the adjustable (adaptive) coefficients may further be based, for example, on the intermediate signal v, the modulating control signal $e_B$, and/or the control signal $e_A$.

Similarly, the output signal $e_A[t]$ may be derived using an optimization process, (which may also be implemented using the estimator 130) based on the input signal u, the control signal e, and the feed-back (observed) signals $e_B$ and y provided to the estimator 130. For example, in situations where the envelope tracking power supply modulator 150 exhibits non-linear behavior (i.e., the relationship between the power supply modulator's output signal $e_B$ and its input signal, $e_A$, is non-linear), the signal $e_A$ may be produced through digital predistortion processing applied to the signals u and e, that achieves some optimization criterion (e.g., to match e to $e_B$). Alternatively, in some embodiments (e.g., when the power supply modulator exhibits substantially linear behavior), processing performed by the actuator 120 to produce the signal $e_A$ may depend only on the signal e (e.g., $e_A$ may be a downsampled version of e, with a bandwidth that is compatible with the bandwidth of the envelope tracking power supply modulator 150) without needing to take the signal u (or some other signal) into account.

Examples of procedures/techniques to derive coefficients (parameters) for weighing basis functions selected for predistortion operations (be it for predistortion operations on a baseband input signal such as u, or on an envelope tracking signal e to modulate a power supply powering a power amplifier) are described in U.S. patent application Ser. No. 16/004,594, entitled "Linearization System," the content of which is incorporated herein by references in its entirety. Briefly, output signal, v, which is provided as input to the transmit chain 110, is generated, based on the input signal u (or, in the embodiments of the systems depicted in FIGS. 1 and 2, the input signal may include a combination of the baseband signal u and the output, e, of an envelope tracker), to include an "inverse nonlinear distortion" (i.e., an inverse of the nonlinear distortion introduced by the transmit chain 110), such that the nonlinear distortion introduced by the transmit chain 106 is substantially cancelled by the inverse nonlinear distortion. The output signal, w is therefore substantially free of nonlinear distortion.

In some examples, a DPD (such as the actuator 120) operates according to an inverse model of the nonlinear distortion of the transmit chain (e.g., the transmit chain 110 of FIG. 1) such that providing the input signal, u, to the DPD causes the DPD/actuator to generate the intermediate input signal, v as follows:

$$v = 2u + \sum_{i=1}^{n} x_i f_i(u)$$

where $f_i(\bullet)$ is the $i^{th}$ basis function of n basis functions and $x_i$ is the $i^{th}$ parameter (e.g., the $i^{th}$ weight) corresponding to the $i^{th}$ basis function. Each basis function is a linear function (e.g., u(t−1)) or a non-linear function (e.g., $|u(t)|^2$) of the input, u, which may include memory (e.g., u(t)*u(t−1)).

To update the parameters, x, used by, for example, the actuator (DPD processor) 120 of FIG. 1, a predictor module (such as the estimator 130 of FIG. 1) processes the input signal to the transmit chain, i.e., the signal v, corresponding the predistorted output of the actuator 120, and a sensed version (e.g., a signal b) of the output signal w of the transmit chain (or some other output module that is downstream of the transmit chain) to generate an updated set of parameters, x'. The sensed signal b is observed via an observation receiver/coupler (such as the coupler 116 of FIG. 1) coupled to the output of a transmit chain. In some embodiments, a synchronizer (not shown) may be used to synchronize or correlate the signals used for the adaptation processes.

In one example, the predictor module determines an updated set of parameters x' that, in combination with the basis functions and the intermediate input signal, v, generate a predicted signal that is as close as possible to the sensed signal, b (e.g., in a least mean squared error sense). This can be restated as:

$$P(v) = \sum_{i=1}^{n} x_i f_i(v)$$

The predictor, P, may be provided to the actuator 120 to update the actuator's coefficients. In some examples, for the predictor P described above, the adaptation processor 130 configures the actuator (digital predistorter) 120 to perform according to an approximate inverse of the predictor P as follows:

$$DPD(u) = P^{-1}(u) \approx 2u - \sum_{i=1}^{n} x_i f_i(u)$$

Alternatively, the DPD parameters may be set as: $a_i = -\alpha_i$.

In another example, the predictor module may be configured to determine an updated set of coefficients & that, in combination with the basis functions and the sensed signal, b, generate a predicted signal, that is as close as possible (e.g., in a least mean squared error sense) to the intermediate predistorted signal, v. This can be restated as:

$$P(b) = \sum_{i=1}^{n} x_i f_i(b)$$

That is, in such embodiments, P is an estimate of a (post) inverse of the nonlinearity of the transmit chain. In some examples, the adaptation processor 130 configures the actuator 120 according to the predictor P as follows:

$$DPD(u) = P(b) = \sum_{i=1}^{n} x_i f_i(b)$$

or essentially $a_i = \alpha_i$.

In another example, updating of the DPD parameters/coefficients may be implemented to generate an updated set of parameters, x', that, in combination with the basis functions, represent a difference between the model of the nonlinear input/output characteristic of the transmit chain and the current nonlinear input/output characteristic of the transmit chain. In one example, the predictor module determines parameters x that, in combination with the basis functions and the input signal, u, to the DPD (rather than using the intermediate signal v) generate a predicted signal, b̂ that is as close as possible to the sensed signal, b (e.g., in a least mean squared error sense), which can be restated as:

$$P(u) = \sum_{i=1}^{n} x_i f_i(u).$$

The parameters, x, in combination with the basis functions represent the difference between the model of the nonlinear input/output characteristics of the transmit chain, and the actual nonlinear input/output characteristic of the transmit chain because the effects both the DPD and the transmit chain on the input signal are represented in the sensed signal b. An output of the predictor module, i.e., P, is provided to a DPD update module which processes the predictor P to update the digital predistorter. In some examples, the actuator combines an approximate inverse of the predictor with the existing DPD according to $a'_i \leftarrow a_i + \alpha_i$. This essentially approximates a cascade of the approximate inverse of the predictor, $P^{-1}$, with the previous DPD configuration to yield the new DPD configuration.

In another example, the predictor module (estimator) determines a set of parameters x that, in combination with the basis functions and the sensed signal, b, generate a predicted signal, û that is as close as possible to the input signal, u (e.g., in a least mean squared error sense), which can be restated as:

$$P(b) = \sum_{i=1}^{n} x_i f_i(b).$$

In some implementations, derivation of the coefficients x for weighing the basis functions used by the digital predistorter implementation of the actuator 120 may be determined in batches using a least-squares process as follows:

$$\alpha = arg\ min|A\alpha-b|_2^2 = arg\ min(\alpha^H A^H A\alpha - 2A^H b\alpha + b^H b)$$

where b is a vector of sensed signal samples and A is a matrix where each column includes the samples of the basis function, $f_i(u)$. The solution for x is therefore:

$$x=(A^H A)^{-1} A^H b.$$

That is, in this formulation, the samples of the sensed signal and the basis functions are used once for the batch, and not used in subsequent determination of future coefficient values x.

The reliability of the computed coefficients, x, can vary based on the desired accuracy (or other performance metric), and the computing resources available. In some embodiments, regularization may be used as a criterion for determining the coefficient values to bias the result away from coefficient values with large magnitudes. In some examples, robustness, reliability, and/or convergence of solutions of the coefficients, x, can be improved by incorporating a history of previous batches of the input as follows:

$$x = \underset{x}{\operatorname{argmin}} \begin{pmatrix} x^H \left[ (1-\lambda) \sum_{i=1}^{n} \lambda^{n-i} A_i^H A_i \right] x \\ -2(1-\lambda) \sum_{i=1}^{n} \lambda^{n-i} A_i^H b_i x \\ + \sum_{i=1}^{n} b_i^H b_i \\ +\rho x^H x \end{pmatrix}$$

where $A_i$ and $b_i$ correspond to inputs and outputs for batch i=1, . . . and x depends on the samples from all batches 1 to n. The above equation is subject to $x_L \leq x \leq x_U$, $0 < \lambda < 1$, and $\rho > 0$.

In the above optimization problem, the large batch term (a Gramian), $A^H A$ may be replaced with $$(1-\lambda) \sum_{i=1}^{n} \lambda^{n-i} A_i^H A_i,$$

which is a "memory Gramian." Use of the memory Gramian improves the convergence properties of the optimization process, safeguards against glitches in system behavior, and improves overall performance of the system.

Figure 3:
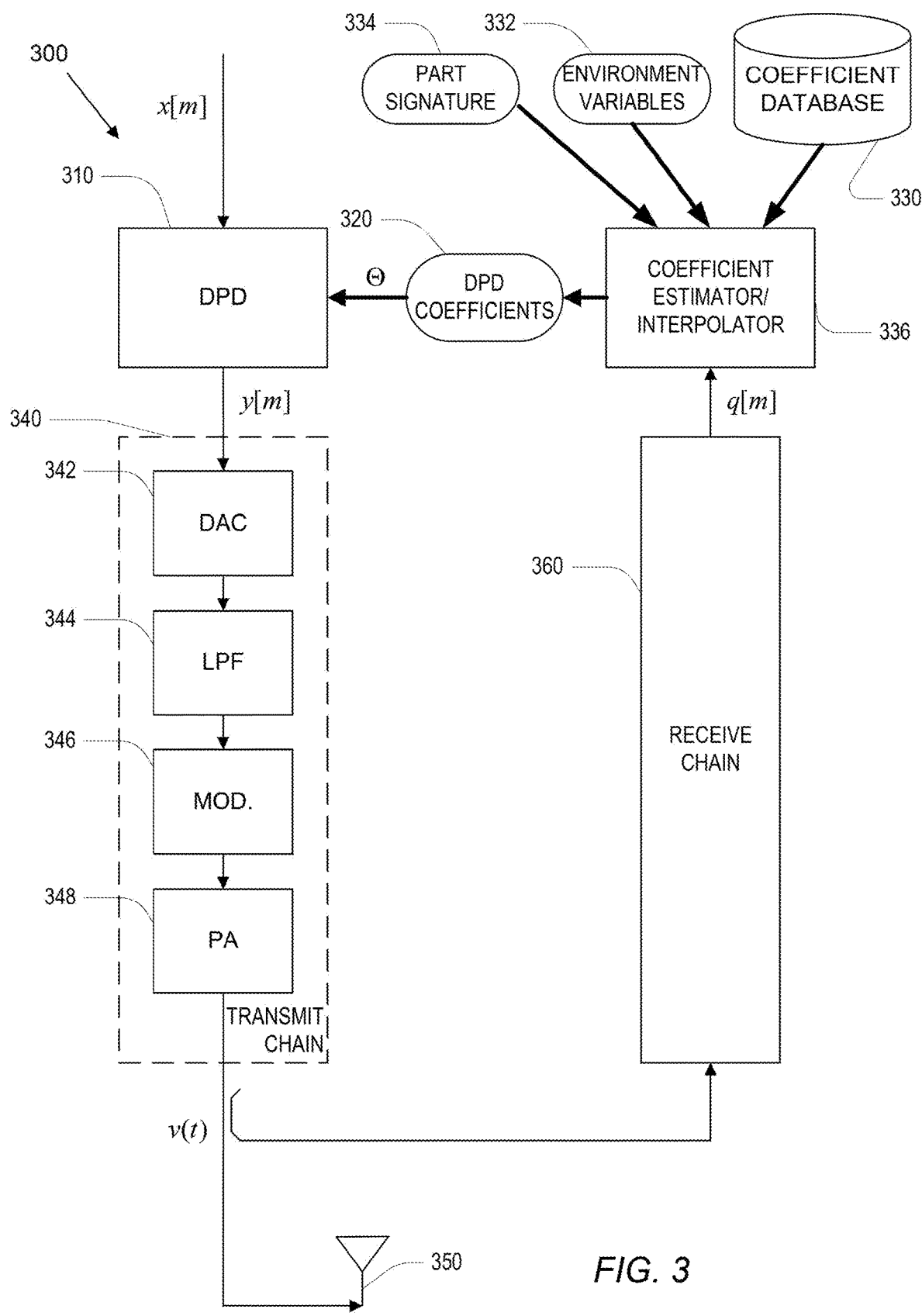
FIG. 3 is a block diagram of an adjustable pre-distorting power amplifier system which may be used, at least in part, in implementations of the system of FIG. 1.

Another example approach to implement determination of DPD parameters is described in U.S. Pat. No. 9,590,668, entitled "Digital Compensator," the content of which is hereby incorporated by reference in its entirety. Briefly, with reference to FIG. 3, a block diagram of an adjustable pre-distorting power amplifier system 300, which may be similar to, or include, the portion of the system 100 comprising the actuator 120 (implementing a DPD processor), the transmit chain 110, and the estimator (predictor module) 130 of the system 100 of FIG. 1, is shown. In the example system 300, a digital input signal x[m] at a baseband or intermediate frequency is passed through a Digital Pre-Distorter (DPD) 310 (which may be similar, in implementation or functionality, to the DPD processing implementation of the actuator 130) to produce a "pre-distorted" input y[m], which is passed through a transmit chain 340 to produce a driving signal v(t) that drives an antenna 350. The transmit chain may include a Digital-to-Analog Converter (DAC) 342, an analog lowpass filter (LPF) 344, and a modulator 346 (e.g., multiplication by a local oscillator) of the output of the LPF 344. The output of the modulator is passed to a power amplifier (PA) 348.

The DPD 310 may be controlled using a controller to determine/compute DPD coefficients (shown as DPD coefficients Θ 320) to adjust the DPD 310 using those determined DPD coefficients. In some embodiments, the DPD coefficients Θ 320 are determined using a database of coefficients 330, and values that essentially characterize the operation "regime" (i.e., a class of physical conditions) of the transmit chain, and/or of other system components (including remote load components and load conditions). These values (e.g., quantitative or categorical digital variables) include environment variables 332 (e.g., temperature, transmitter power level, supply voltage, frequency band, load characteristics, etc.) and/or a part "signature" 334, which represents substantially invariant characteristics, and which may be unique to the electronic parts of the transmit chain 340.

Determined system characteristic values or attributes may be provided to a coefficient estimator/interpolator 336 (e.g., via a feedback receive chain 360). The determined characteristics and metrics may be used to estimate/derive appropriate DPD coefficients. For example, the DPD coefficient sets may be computed so as to achieve some desired associated distortion measures/metrics that characterize the effects of the preprocessing, including an error vector magnitude (EVM), an adjacent channel power ratio (ACPR), operating band unwanted emissions (OBUE) or other types of distortion measures/metrics.

The coefficient interpolator 336 uses the various inputs it receives to access the coefficient database 332 and determine and output the corresponding DPD coefficients 320. A variety of approaches may be implemented by the coefficient estimator/interpolator 336, including selection and/or interpolation of coefficient values in the database according to the inputs, and/or applying a mathematical mapping of the input represented by values in the coefficient database. For example, the estimator/interpolator 336 may be configured to select, from a plurality of sets of DPD coefficients (in the database 330), a DPD coefficient set associated with one or more pre-determined system characteristics or some metric derived therefrom. The DPD coefficients used to control/adjust the DPD 310 may be determined by selecting two or more sets of DPD coefficients from a plurality of sets of DPD coefficients (maintained in the database 330) based on the system characteristics. An interpolated set of DPD coefficients may then be determined from the selected two or more sets of DPD coefficients.

Turning back to FIG. 1, the envelope tracking power supply modulator 150 modulates the power supplied to the PA 114 using the resultant modulating signal $e_A[t]$ that was derived, by the actuator 120, based on the envelope tracking signal e[t] and optionally the input signal u. The PA 114, whose power is modulated by $e_B$ (e.g., the modulator 150, which may be implemented using shaping table or through some other realization, produces the output control signal, $e_B$, responsive to the modulating input $e_A[t]$), processes the predistorted intermediate signal v[t] to produce an output signal w(t) that is substantially free of predistortion that would otherwise have occurred had u[t] not been predistorted. As noted, by controlling the intermediate signal v and the modulating signal $e_A[t]$, the PA can be actuated to operate in a particular non-linear manner (or profile) that can more optimally process the predistorted intermediate signal v[t] (e.g., use less power). As depicted in FIG. 1, the signal $e_A[t]$ produced by the actuator 120 has a bandwidth that is compatible with the bandwidth that can be handled by the envelope tracking power supply modulator 150. Thus, if, as shown in the example of FIG. 1, the modulator 150 has a maximum bandwidth of 10 MHz, the actuator 120 may be configured to produce a signal $e_A[t]$ with 10 Msps.

The system 100 illustrated in FIG. 1 may be at least part of a digital front end of a device or system (such as a network node, e.g., a WWAN base station or a WLAN access point, or of a mobile device). As such, the system 100 may be electrically coupled to communication modules implementing wired communications with remote devices (e.g., via network interfaces for wired network connections such as Ethernet connections), or wireless communications with such remote devices. In some embodiments, the system 100 may be used locally within a device or system to perform processing (predistortion processing or otherwise) on various signals produced locally in order to generate a resultant processed signal (whether or not that resultant signal is then communicated to a remote device).

In some embodiments, at least some functionality of the linearization system 100 (e.g., generation of an envelope signal, performing predistortion on the signals u and/or e using adaptable coefficients derived through based on one or more of u, e, v, y, $e_A$ and/or $e_B$ depicted in FIG. 1) may be implemented using a controller (e.g., a processor-based controller) included with one or more of the modules of the system 100 (the actuator 120, the estimator (adaptation module) 130, or any of the other modules of the system 100). The controller may be operatively coupled to the various modules or units of the system 100, and be configured to generate an efficient envelope tracking signal e, compute predistorted sample values for v and $e_A$ (the outputs of the actuator 120 or the actuator 200), update the actuator's coefficients, etc. The controller may include one or more microprocessors, microcontrollers, and/or digital signal processors that provide processing functionality, as well as other computation and control functionality. The controller may also include special purpose logic circuitry, e.g., an FPGA (field programmable gate array), an ASIC (application-specific integrated circuit), a DSP processor, a graphics processing unit (GPU), an accelerated processing unit (APU), an application processor, customized dedicated circuitry, etc., to implement, at least in part, the processes and functionality for the system 100. The controller may also include memory for storing data and software instructions for executing programmed functionality within the device. Generally speaking, a computer accessible storage medium may include any non-transitory storage media accessible by a computer during use to provide instructions and/or data to the computer. For example, a computer accessible storage medium may include storage media such as magnetic or optical disks and semiconductor (solid-state) memories, DRAM, SRAM, etc.

Figure 4:
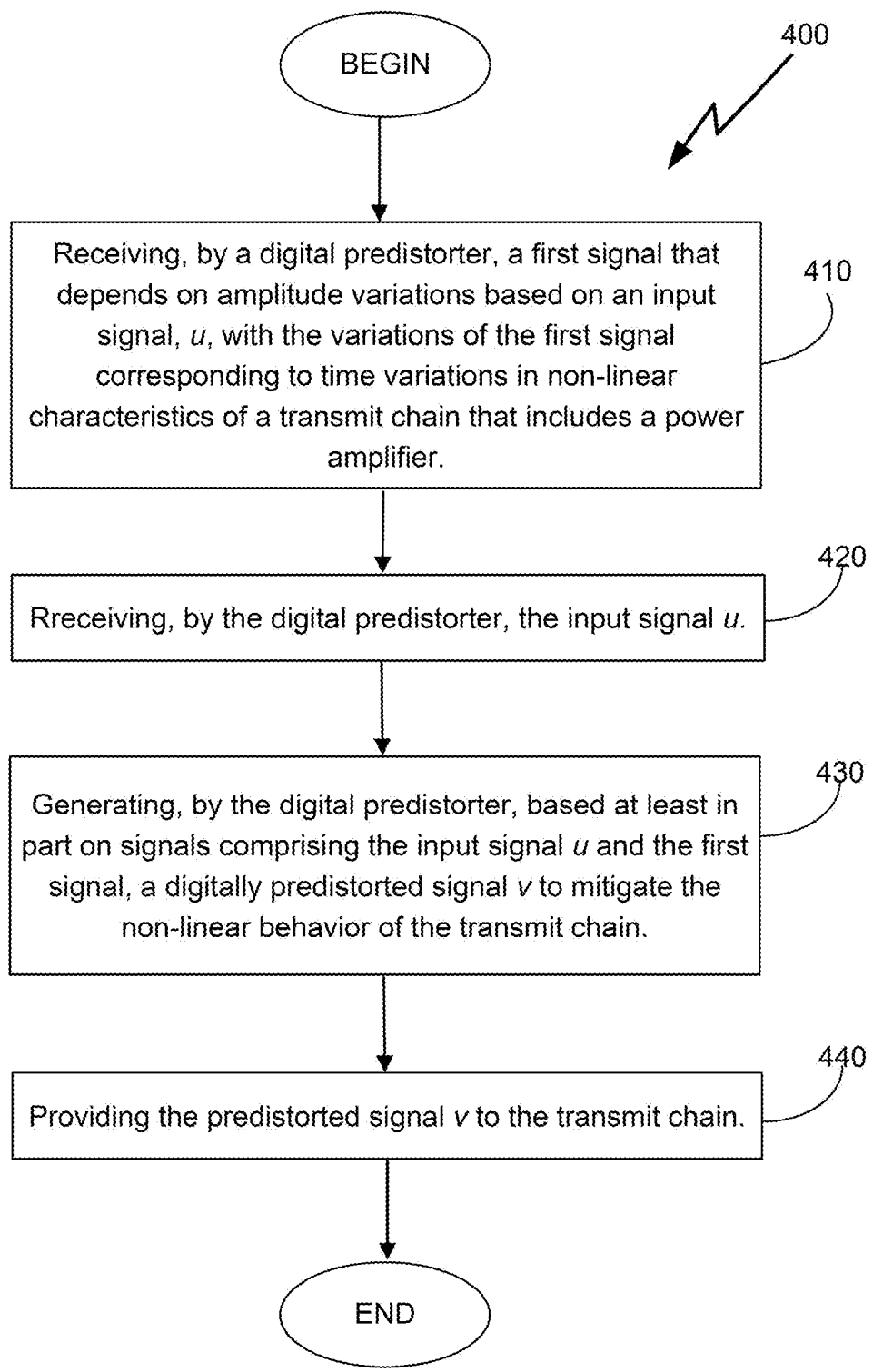
FIG. 4 is a flowchart of an example procedure for digital predistortion.

With reference next to FIG. 4, a flowchart of an example procedure 400 for digital predistortion is shown. The procedure 400 includes receiving 410, by a digital predistorter (e.g., by a receiver section of a digital predistorter device such as the actuators 120 or 200 depicted in FIGS. 1 and 2), a first signal that depends on amplitude variations based on an input signal, u, with the variations of the first signal corresponding to time variations in non-linear characteristics of a transmit chain such as the transmit chain 110 depicted in FIG. 1) that includes a power amplifier.

In some embodiments, the first signal may correspond to a time varying signal e generated by an envelope tracker (such as the tracker 140 of FIG. 1), in which case, receiving the first signal may include monitoring, by the digital predistorter, a time-varying signal e generated by an envelope tracker that received a copy of the input signal u. The signal e tracks the shape of the envelope of the signa u, and thus e depends on amplitude variations of the input signal u. In some examples, the procedure 400 may further include filtering the time-varying signal e.

As noted, in some embodiments, the time-varying control signal e may be determined according to an optimization process that is based on characteristics of the transmit chain, and with the resultant control signal being based on parameters that can be adjusted or selected based on desired behavior of the transmit chain and/or the envelope tracking signal. For example, the determined tracking signal e can be one whose response speed to variations of the input signal can be adjusted (so that the response can be varied from slow to fast). A fast-responding envelope tracking control signal to modulate the power supply modulator (controlling power to the transmit chain) may result in a more efficient modulator (because the power provided to the transmit chain will more closely follow variations to the input signal u, thus reducing power waste), but may require more of a computational effort to derive. In another example, the determined control signal e may be one that is more compatible with the bandwidth of the transmit chain. Thus, in some embodiments, determining the control signal e may include determining the time varying-control signal e satisfying a set of constrains, including: i) a first constraint in which $e[t] \geq h(|u[t]|)$, where h(.) defines a relation between instantaneous power of the signal u and a power supply of the transmit chain, ii) a second constraint imposing maximal value and curvature bounds for the signal e[t], such that $e[t] \leq E0$, and $|2e[t]-e[t-1]-e[t+1]| \leq E2$, where E0 and E2 are values representative of operational characteristics of the transmit chain, and iii) a third constraint requiring that values of e[t] be as small as possible, subject to the first and second constraints. The value E2 may, for example, be representative of a bandwidth of the transmit chain and/or a response speed of the transmit chain to variations in amplitude of the input signal u.

With continued reference to FIG. 4, the procedure 400 additionally includes receiving 420, by the digital predistorter (e.g., by the receiver section of the digital predistorter device), the input signal u, and generating 430, by the digital predistorter (e.g., by a controller circuit of the digital predistorter device), based at least in part on signals comprising the input signal u and the first signal, a digitally predistorted signal v to mitigate the non-linear behavior of the transmit chain.

In examples in which the first signal received by the digital predistorter is the time-varying signal e, the time-varying signal e may generated from the input signal u such that the time-varying signal e causes at least some non-linear behavior of the power amplifier. In such embodiments, generating the digitally predistorted signal v may include using the time-varying signal e to digitally predistort the input signal u such that the output of the transmit chain resulting from digitally predistorting the input signal u is substantially free of the at least some non-linear distortion caused by the time-varying signal e. The signal e may be generated so as to, for example, underpower the power amplifier to controllably cause non-linear behavior that can be mitigated through the predistortion operations of a digital predistorter (e.g., the actuator 120 of FIG. 1), with the predistortion operation being adapted in accordance with the input signal u and the control signal e (i.e., the predistortion operations are based on knowledge of the control signal e that is causing the non-linear behavior, thus potentially resulting in a more efficient joint operation of the envelope tracker, the power supply modulator, the transmit chain, and/or the digital predistorter).

As noted, in some embodiments, the digital predistortion operations (by the actuator 120) are based on the bandpass input signal u, and the envelope tracking control signal e, thus allowing the predistortion to take into account (at least implicitly) the power modulation of the transmit chain. Accordingly, performing the digital predistortion on the combined signal may include performing the digital predistortion on the combined signal comprising the input signal u and the time-varying control signal e to produce the digitally predistorted signal v according to:

$$v[t] = u[t] + \sum_{k=1}^{n} x_k B_k(q_u[t], q_e[t]) \text{ with}$$

$$q_u[t] = \begin{bmatrix} u[t+l-1] \\ u[t+l-2] \\ \vdots \\ u[t+l-\tau] \end{bmatrix} \text{ and with}$$

$$q_e[t] = \begin{bmatrix} e[t+s(l-1)] \\ e[t+s(l-2)] \\ \vdots \\ e[t+s(l-\tau)] \end{bmatrix}$$

In such embodiments, $B_k$ are basis functions, $q_u[t]$ and $q_e[t]$ are stacks of recent baseband and envelope input samples, respectively, s is a time scale separation factor representative of a ratio of time constants of the power amplifier and a modulator powering the power amplifier, and $x_k$ are computed coefficients to weigh the basis functions. In some examples, the procedure 400 may further include computing, according to an optimization process that is based, at least in part, on observed samples of the transmit chain, the computed coefficients $x_k$ to weigh the basis functions $B_k$.

In some embodiments, the procedure 400 may also include generating a resultant envelope tracking signal, $e_A$, through digital predistortion performed on the combined signal comprising the input signal u and the time-varying control signal e, to mitigate non-linear behavior of a power supply modulator that is producing output, based on the resultant envelope tracking signal, $e_A$, to modulate the power provided to the power amplifier of the transmit chain. In such embodiments, $e_A$ has a lower bandwidth than the time-varying control signal e. In some embodiments, the signal $e_A$ (produced by the actuator 120) may depend only on the signal e. For example, the signal $e_A$ may simply be a down-sampled signal required for compatibility with the power supply modulator. In such embodiments, the procedure 400 may thus also include generating a resultant envelope tracking signal, $e_A$, as a function of the time-varying control signal e, with $e_A$ having a lower bandwidth than the time-varying control signal e, and with $e_A$, provided to a power supply modulator producing output, based on the resultant envelope tracking signal, $e_A$, to modulate the power provided to the power amplifier of the transmit chain. In some examples, generating the resultant envelope tracking signal $e_A$ may include down-sampling the time-varying control signal e to generate a resultant down-sampled envelope tracking signal, $e_A$.

Turning back to FIG. 4, as shown, the procedure 400 further includes providing 440 (e.g., by an output section of a digital predistorter device) the predistorted signal v to the transmit chain (whose non-linear behavior depends, at least in part, on amplitude variations of the signal u, as represented by the signal e or $e_A$). In some examples, the procedure 400 may further include computing samples of the digitally predistorted signal, v, provided to the transmit chain, as a non-linear function of samples of the input signal u and the first signal.

Figure 5:
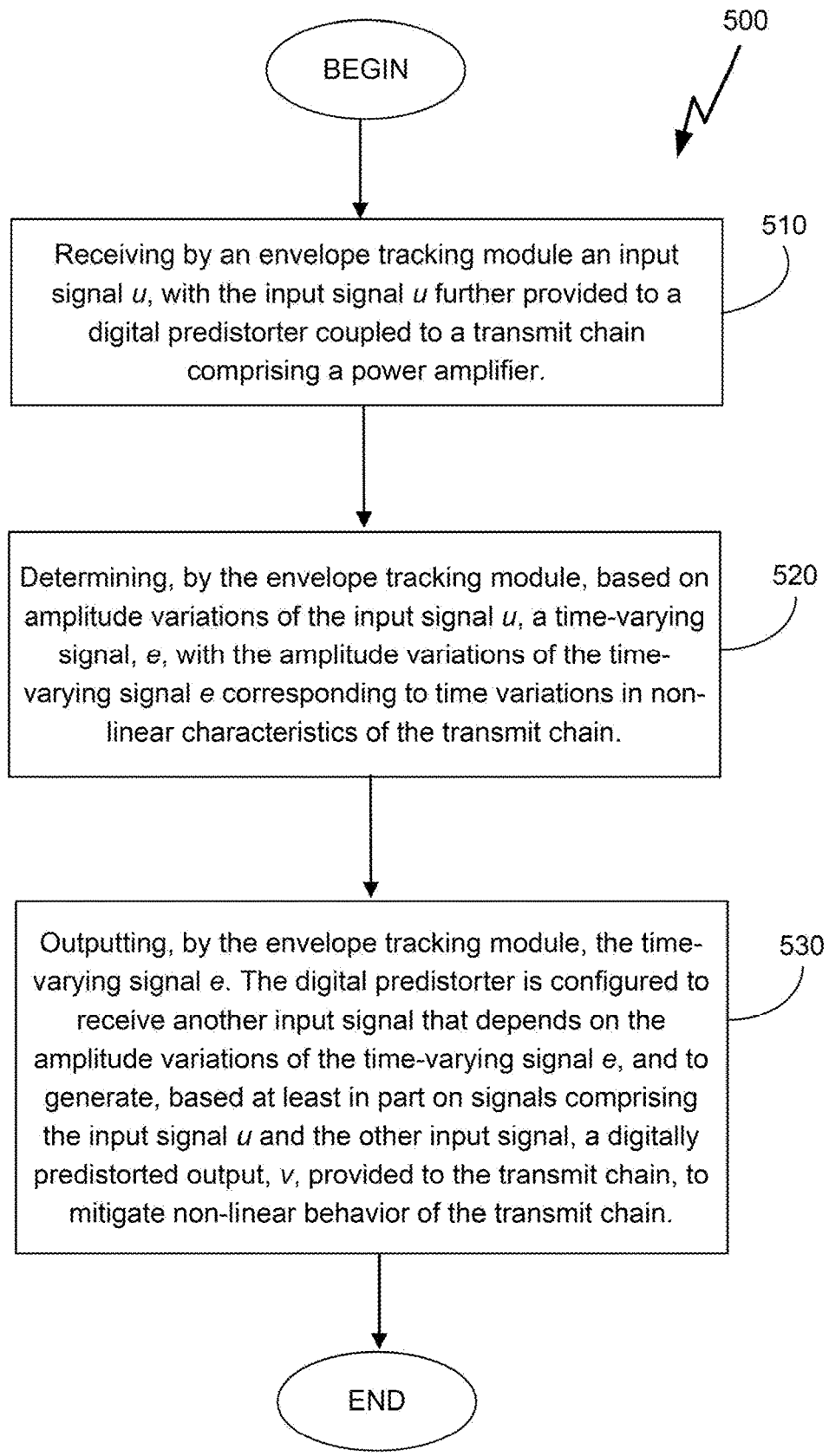
FIG. 5 is a flowchart of an example procedure to control electrical operation of a transmit chain.

With reference now to FIG. 5, a flowchart of an example procedure 500 to control electrical operation of a transmit chain (via the generation of envelope tracking control signal) is provided. The procedure 500 is generally performed by an envelope tracking module (envelope generator, such as the envelope generator 140 of FIG. 1). As shown, the procedure 500 includes receiving 510 by the envelope tracking module (e.g., by a receiver/receiver section of an envelope tracking module) an input signal u. The input signal u is further provided to a digital predistorter (e.g., the actuator 120) coupled to the transmit chain (such as the transmit chain 110), with the transmit chain comprising a power amplifier (e.g., the PA 114 of FIG. 1).

The procedure 500 further includes determining 520, by the envelope tracking module (e.g., by a controller of the envelope tracking module), based on amplitude variations of the input signal u, a time-varying signal, e, with the amplitude variations of the time-varying signal e corresponding to time variations in non-linear characteristics of the transmit chain. The procedure 500 further includes outputting 530, by the envelope tracking module (e.g., by an output section of the envelope tracking module), the time-varying signal e. The digital predistorter is configured to receive another input signal that depends on the amplitude variations of the time-varying signal e, and to generate, based at least in part on signals comprising the input signal u and the other input signal, a digitally predistorted output, v, provided to the transmit chain, to mitigate non-linear behavior of the transmit chain.

In some examples, determining the time-varying signal, e, may include determining the time-varying signal e to cause a power supply modulator controlling the electrical operation of the transit chain to underpower the power amplifier so as to cause the transmit chain to operate in a non-linear mode. Thus, in some embodiments of FIG. 5, the transmit chain may intentionally be controlled to operate in a non-linear mode (in this example, through underpowering the transmit chain, although in other embodiments, the transmit chain may be placed in non-linear mode by other means, such as overpowering the transmit chain) since the non-linear effects may be efficiently corrected through the digital predistorter of the system, while the underpowering can conserve power and prolong the life of the components of the linearization system.

In the procedure 500, determining the time-varying signal, e, may include deriving the time-varying signal, e, according to one or more constraints representative of characteristics of the transmit chain. Deriving the time-varying signal e may include deriving the time-varying signal e satisfying a set of constraints that includes a first constraint in which $e[t] \geq h(|u[t]|)$, where $h(.)$ defines a relation between instantaneous power of the input signal u and a power supply of the transmit chain, a second constraint imposing maximal value and curvature bounds for the signal e, such that $e[t] \leq E0$, and $|2e[t]-e[t-1]-e[t+1]| \leq E2$, where E0 and E2 are values representative of operational characteristics of the power amplifier, and a third constraint requiring that values of e[t] be as small as possible, subject to the first and second constraints.

Figure 6A:
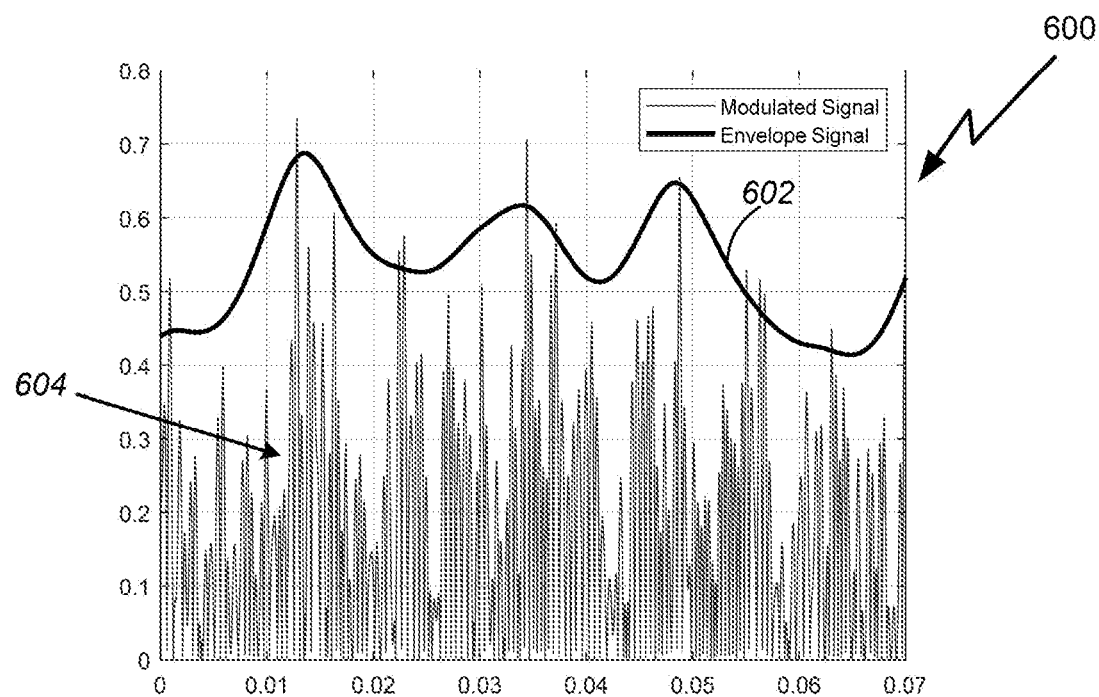
FIGS. 6A-C are graphs showing different envelope tracking responses.
Figure 6B:
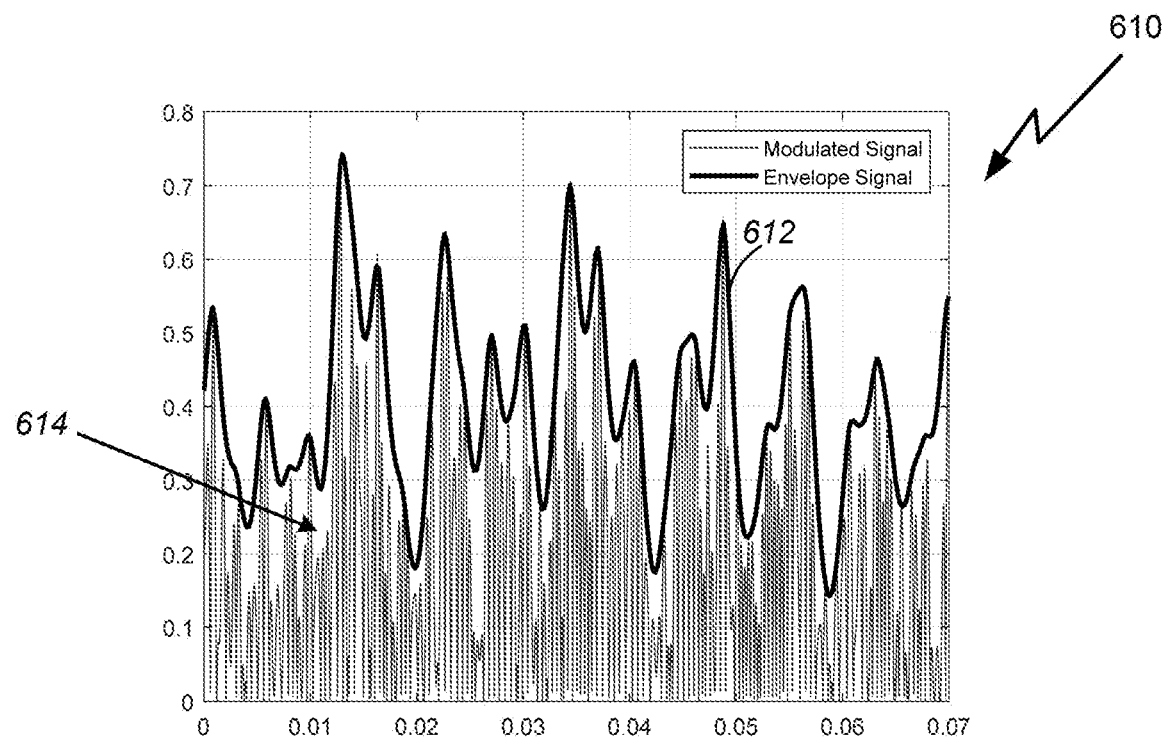
Figure 6C:
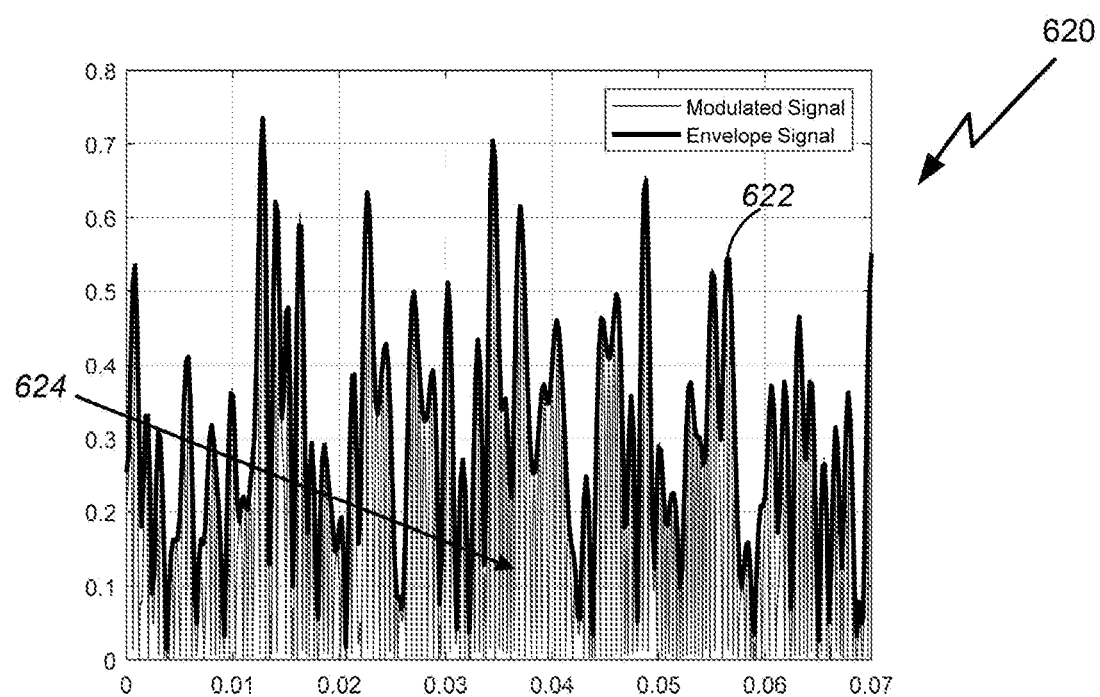

In some examples, the parameter E2 may be representative of one or more of, for example, a bandwidth of the transmit chain, or a response speed of the transmit chain to variations in amplitude of the input signal u. Thus, by selecting/varying the parameter E2, the response speed of the envelope tracking signal, and/or its bandwidth, can be controlled. For example, consider the graphs provided in FIGS. 6A-C, which show different envelope tracking responses, each of which may correspond to different values of E2 in the determination of envelope tracking control signal e (the appropriate values of E2 may be determined experimentally or analytically). In FIG. 6A, the graph 600 shows a slow envelope tracking signal 602 that can track the low frequency behavior of a signal 604, but cannot track the fast changing behavior of the signal 604. In this example, the curve 602 (corresponding to the envelope tracking signal) is fairly smooth, and has a relatively small bandwidth. FIG. 6B includes a graph 610 showing a mid-range envelope tracking signal 612, that can track the general shape of the spikes in a signal 614, but still has some noticeable deviations between the shape of the tracking envelope 612 and the signal 614. In this example, the envelope can follow some of the higher frequency components of the signal 614, and accordingly is not as smooth as the curve 602 of FIG. 6A. Lastly, FIG. 6C includes a graph 620 with a fast-response envelope 622, that can more closely follow the variations in a signal 624 than the envelope signals 602 and 612 could. In the example of FIG. 6C, the envelope signal 622 has a relatively large bandwidth, but the signal is less smooth than either of the envelope signals 602 and 612 of FIGS. 6A and 6B, respectively.

As noted above, in some embodiments, the time-varying signal e may also be provided to the digital predistorter. Thus, the procedure 500 may further include providing, by the envelope tracking module, the time-varying signal e to the digital predistorter. In such embodiments, the other input signal of the digital predistorter may be the time varying signal e. Providing the time-varying signal may include providing the time-varying signal e to the digital predistorter to produce a resultant control signal, $e_A$, provided to a power supply modulator controlling the electrical operation of the transit chain. The digital predistorter configured to produce the resultant control signal $e_A$ may be configured to compute, based, at least in part, on observed samples of the transmit chain, coefficients to weigh basis functions applied to samples of the input signal u and the time-varying signal e to generate the resultant control signal $e_A$.

In the embodiments of FIG. 5 in which the predistorter is provided with the input signal u and the time-varying signal e, the digital predistorter configured to generate the digitally predistorted output, v, may be configured to generate the digitally predistorted output, v, based on the input signal u and the time-varying signal, e, according to:

$$v[t] = u[t] + \sum_{k=1}^{n} x_k B_k(q_u[t], q_e[t]) \text{ with}$$

$$q_u[t] = \begin{bmatrix} u[t+l-1] \\ u[t+l-2] \\ \vdots \\ u[t+l-\tau] \end{bmatrix} \text{ and with}$$

$$q_e[t] = \begin{bmatrix} e[t+s(l-1)] \\ e[t+s(l-2)] \\ \vdots \\ e[t+s(l-\tau)] \end{bmatrix}$$

with $B_k$ being basis functions, $q_u[t]$ and $q_e[t]$ are stacks of recent baseband and envelope input samples, respectively, s is a time scale separation factor representative of a ratio of time constants of the power amplifier and the power supply modulator powering the power amplifier, and $x_k$ are computed coefficients to weigh the basis functions. The procedure 500 may also include computing according to an optimization process based, at least in part, on observed samples of the transmit chain, the computed coefficients $x_k$ to weigh the basis functions $B_k$.

Figure 7:
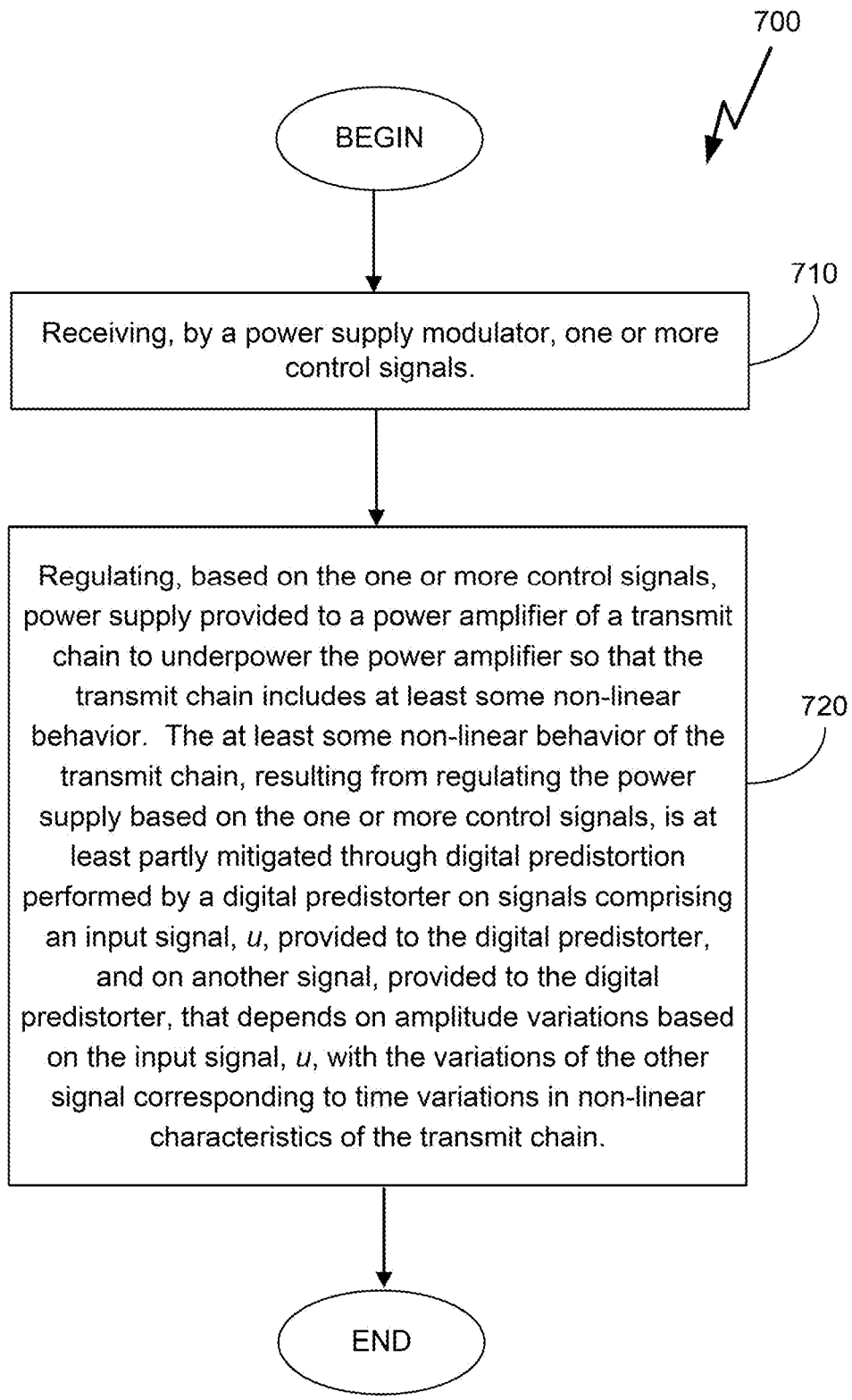
FIG. 7 is a flowchart of an example procedure, generally performed at a power supply modulator, to control electrical operation of a transmit chain.

Turning next to FIG. 7, a flowchart of another example procedure 700, generally performed at a power supply modulator (such as the power supply modulator 150 of FIG. 1) of a linearization system (such as the system 100 of FIG. 1) is shown. The procedure 700 includes receiving 710, by a power supply modulator (e.g., by a receiver section of a power supply modulator), one or more control signals.

The procedure 700 further includes regulating 720 (e.g., by a regulator/controller circuit of the power supply modulator), based on the one or more control signals, power supply provided to a power amplifier of a transmit chain to underpower the power amplifier so that the transmit chain includes at least some non-linear behavior. The at least some non-linear behavior of the transmit chain, resulting from regulating the power supply based on the one or more control signals, is at least partly mitigated through digital predistortion performed by a digital predistorter (e.g., the actuator 120) on signals comprising an input signal, u, provided to the digital predistorter, and on another signal, provided to the digital predistorter, that depends on amplitude variations based on the input signal, u. The variations of the other signal correspond to time variations in non-linear characteristics of the transmit chain.

In some embodiments, the other signal provided to the digital predistorter includes a time-varying signal e generated by an envelope tracker that receives a copy of the input signal u. As described herein, the time-varying control signal e may be derived based on a set of constraints, including a first constraint in which $e[t] \geq h(|u[t]|)$, where $h(.)$ defines a relation between instantaneous power of the input signal u and a power supply of the transmit chain, a second constraint imposing maximal value and curvature bounds for the signal e, such that $e[t] \leq E0$, and $|2e[t]-e[t-1]-e[t+1]| \leq E2$, where E0 and E2 are values representative of operational characteristics of the power amplifier, and a third constraint requiring that values of e[t] be as small as possible, subject to the first and second constraints. As noted, E2 may be representative of one or more of, for example, a bandwidth of the transmit chain, and/or a response speed of the transmit chain to variations in amplitude of the input signal u.

In some embodiments, receiving the one or more control signals may include receiving a time-varying control signal, $e_A$, derived based, at least in part, on the time-varying signal e, with $e_A$ having a lower bandwidth than the time-varying signal e. Receiving the time-varying signal $e_A$ may include receiving the time-varying signal, $e_A$, generated through digital predistortion performed on multiple signals comprising the input signal u and the time-varying signal e, to mitigate non-linear behavior of the power supply modulator producing output based on the resultant time-varying signal, $e_A$. In some examples, receiving the time-varying signal $e_A$ may include receiving the time-varying control signal, $e_A$, generated as a bandwidth lowering function of the time-varying signal e. The bandwidth lowering function may include a down-sampling function applied to the time-varying signal e.

The digital predistorter may be configured to generate digitally predistorted output signal, v, from the signals comprising the input signal u and the time-varying control signal e, according to:

$$v[t] = u[t] + \sum_{k=1}^{n} x_k B_k(q_u[t], q_e[t]) \text{ with}$$

$$q_u[t] = \begin{bmatrix} u[t+l-1] \\ u[t+l-2] \\ \vdots \\ u[t+l-\tau] \end{bmatrix} \text{ and with}$$

$$q_e[t] = \begin{bmatrix} e[t+s(l-1)] \\ e[t+s(l-2)] \\ \vdots \\ e[t+s(l-\tau)] \end{bmatrix}$$

with $B_k$ being basis functions, $q_u[t]$ and $q_e[t]$ being stacks of recent baseband and envelope input samples, respectively, s being a time scale separation factor representative of a ratio of time constants of the power amplifier and the power supply modulator powering the power amplifier, and $x_k$ being computed coefficients to weigh the basis functions. The coefficients $x_k$ may be computed according to an optimization process based, at least in part, on observed samples of the transmit chain. In some examples, the coefficients $x_k$ computed according to the optimization process are computed according to the optimization process and further based on an output of the power supply modulator, the output being one of, for example, a voltage provided to the power amplifier, and/or a control signal to cause a corresponding voltage to be provided to the power amplifier.

The above implementations, as illustrated in FIGS. 1-7, are applicable to a wide range of technologies that include RF technologies (including WWAN technologies, such as cellular technologies, and WLAN technologies), satellite communication technologies, cable modem technologies, wired network technologies, optical communication technologies, and all other RF and non-RF communication technologies. The implementations described herein encompass all techniques and embodiments that pertain to use of digital predistortion in various different communication systems.

In some implementations, a computer accessible non-transitory storage medium includes a database (also referred to as a "design structure" or "integrated circuit definition dataset") representative of a system including some or all of the components of the linearization and envelope tracking implementations described herein. Generally speaking, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates which also represents the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, the database may itself be the netlist (with or without the synthesis library) or the data set.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate in the context of the systems, devices, circuits, methods, and other implementations described herein. "Substantially" as used herein when referring to a measurable value such as an amount, a temporal duration, a physical attribute (such as frequency), and the like, also encompasses variations of +20% or +10%, +5%, or +0.1% from the specified value, as such variations are appropriate in the context of the systems, devices, circuits, methods, and other implementations described herein.

As used herein, including in the claims, "or" as used in a list of items prefaced by "at least one of" or "one or more of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Also, as used herein, unless otherwise stated, a statement that a function or operation is "based on" an item or condition means that the function or operation is based on the stated item or condition and may be based on one or more items and/or conditions in addition to the stated item or condition.

Although particular embodiments have been disclosed herein in detail, this has been done by way of example for purposes of illustration only, and is not intended to be limit the scope of the invention, which is defined by the scope of the appended claims. Features of the disclosed embodiments can be combined, rearranged, etc., within the scope of the invention to produce more embodiments. Some other aspects, advantages, and modifications are considered to be within the scope of the claims provided below. The claims presented are representative of at least some of the embodiments and features disclosed herein. Other unclaimed embodiments and features are also contemplated.

The invention claimed is:

1. A method for digital predistortion comprising:
   receiving, by a digital predistorter, a first signal that depends on amplitude variations based on an input signal, u, wherein the variations of the first signal correspond to time variations in non-linear characteristics of a transmit chain that includes a power amplifier, wherein receiving the first signal comprises monitoring by the digital predistorter a time-varying signal e generated by an envelope tracker of the input signal u;
   receiving, by the digital predistorter, the input signal u;
   generating, based on the received time-varying signal e, a resultant time-varying signal, $e_A$, through digital predistortion performed on the signals comprising the input signal u and the time-varying signal e;
   providing the time varying signal, $e_A$, for controlling power provided to the power amplifier of the transmit chain; and
   generating, by the digital predistorter, based at least in part on signals comprising the input signal u and the time-varying signal e, a digitally predistorted signal v to mitigate the non-linear behavior of the transmit chain; and
   providing the predistorted signal v to the transmit chain.

2. The method of claim 1, further comprising computing samples of the digitally predistorted signal, v, provided to the transmit chain, as a non-linear function of samples of the input signal u and the time-varying signal e.

3. The method of claim 1, wherein the time-varying signal $e_A$ is generated from the input signal u such that the time-varying signal $e_A$ causes at least some non-linear behavior of the power amplifier;
   and wherein generating the digitally predistorted signal v comprises using the time-varying signal e to digitally predistort the input signal u such that the output of the transmit chain resulting from digitally predistorting the input signal u is substantially free of the at least some non-linear distortion caused by the time-varying signal e.

4. The method of claim 1, wherein the time-varying signal e is generated to satisfy a set of constrains, including:
   a first constraint in which $e[t] \geq h(|u[t]|)$, where $h(.)$ defines a relation between instantaneous power of the input signal u and a power supply of the transmit chain,
   a second constraint imposing maximal value and curvature bounds for the signal $e[t]$, such that $e[t] \leq E0$, and $|2e[t] - e[t-1] - e[t+1]| \leq E2$, where E0 and E2 are values representative of operational characteristics of the transmit chain, and
   a third constraint requiring that values of $e[t]$ be as small as possible, subject to the first and second constraints.

5. The method of claim 1, wherein generating the digitally predistorted signal v based on the signals comprising the input signal u and the time-varying signal e, comprises:
   generating the digitally predistorted signal v based, at least in part, on the input signal u and the time-varying signal e to produce the digitally predistorted signal v according to:

$$v[t] = u[t] + \sum_{k=1}^{n} x_k B_k(q_u[t], q_e[t]) \text{ with}$$

$$q_u[t] = \begin{bmatrix} u[t+l-1] \\ u[t+l-2] \\ \vdots \\ u[t+l-\tau] \end{bmatrix} \text{ and with}$$

$$q_e[t] = \begin{bmatrix} e[t+s(l-1)] \\ e[t+s(l-2)] \\ \vdots \\ e[t+s(l-\tau)] \end{bmatrix}$$

wherein $B_k$ are basis functions, $q_u[t]$ and $q_e[t]$ are stacks of recent baseband and envelope input samples, respectively, s is a time scale separation factor representative of a ratio of time constants of the power amplifier and a modulator powering the power amplifier, and $x_k$ are computed coefficients to weigh the basis functions.

6. The method of claim 5, further comprising:
   computing according to an optimization process based, at least in part, on observed samples of the transmit chain, the computed coefficients $x_k$ to weigh the basis functions $B_k$.

7. The method of claim 1, further comprising:
   wherein generating the resultant time-varying signal, $e_A$, comprises generating the resultant time-varying signal, $e_A$, with a lower bandwidth than the time-varying signal e.

8. The method of claim 7, further comprising:
   down-sampling the resultant time-varying signal, $e_A$, provided to the power supply modulator producing the output to modulate, based on the resultant down-sampled time-varying signal, $e_A$, the power provided to the power amplifier of the transmit chain.

9. The method of claim 1, further comprising:
   filtering the time-varying signal e.

10. A digital predistorter comprising:
    a receiver section to receive an input signal, u, and a first signal that depends on amplitude variations based on the input signal, u, wherein the variations of the first signal correspond to time variations in non-linear characteristics of a transmit chain comprising a power amplifier, wherein the receiver section configured to receive the first signal is configured to monitor a time-varying signal e generated by an envelope tracker that of the input signal u;
    a controller to:
      generate, based at least in part on signals comprising the input signal u and the time-varying signal e, a digitally predistorted signal v to mitigate the non-linear behavior of the transmit chain; and
      generate, based on the received time-varying signal e, a resultant time-varying signal, $e_A$, through digital predistortion performed on the signals comprising the input signal u and the time-varying signal e;
      provide the time varying signal, $e_A$, for controlling power provided to the power amplifier of the transmit chain; and an output section to provide the predistorted signal v to the transmit chain.

11. The digital predistorter of claim 10, wherein the digitally predistorted signal v is provided to the transmit chain as digital samples computed as a non-linear function of samples of the input signal u and the time-varying signal e.

12. The digital predistorter of claim 10, wherein the time-varying signal $e_A$ is generated from the input signal u such that the time-varying signal $e_A$ causes at least some non-linear behavior of the power amplifier;

and wherein the controller configured to generate the digitally predistorted signal v is configured to use the time-varying signal e to digitally predistort the input signal u such that the output of the transmit chain resulting from digitally predistorting the input signal u is substantially free of the at least some non-linear distortion caused by the time-varying signal e.

13. The digital predistorter of claim 10, wherein the time-varying signal e is generated to satisfy a set of constrains, including:

a first constraint in which $e[t] \geq h(|u[t]|)$, where $h(.)$ defines a relation between instantaneous power of the input signal u and a power supply of the transmit chain, a second constraint imposing maximal value and curvature bounds for the signal e[t], such that $e[t] \leq E0$, and $|2e[t]-e[t-1]-e[t+1]| \leq E2$, where E0 and E2 are values representative of operational characteristics of the transmit chain, and a third constraint requiring that values of e[t] be as small as possible, subject to the first and second constraints.

14. The digital predistorter of claim 10, wherein the controller configured to generate the digitally predistorted signal v based on the signals comprising the input signal u and the time-varying signal e, is configured to:

generate the digitally predistorted signal v based, at least in part, on the input signal u and the time-varying signal e to produce the digitally predistorted signal v according to:

$$v[t] = u[t] + \sum_{k=1}^{n} x_k B_k(q_u[t], q_e[t]) \text{ with}$$

$$q_u[t] = \begin{bmatrix} u[t+l-1] \\ u[t+l-2] \\ \vdots \\ u[t+l-\tau] \end{bmatrix} \text{ and with}$$

$$q_e[t] = \begin{bmatrix} e[t+s(l-1)] \\ e[t+s(l-2)] \\ \vdots \\ e[t+s(l-\tau)] \end{bmatrix}$$

wherein $B_k$ are basis functions, $q_u[t]$ and $q_e[t]$ are stacks of recent baseband and envelope input samples, respectively, s is a time scale separation factor representative of a ratio of time constants of the power amplifier and a modulator powering the power amplifier, and $x_k$ are computed coefficients to weigh the basis functions.

15. The digital predistorter of claim 10, wherein the controller:

configured to generate the resultant time-varying signal, $e_A$, is configured to generate the resultant time-varying signal, $e_A$, with a lower bandwidth than the time-varying signal e.

16. The digital predistorter of claim 15, wherein the controller is further configured to:

down-sample the resultant time-varying signal, $e_A$, provided to the power supply modulator producing the output to modulate, based on the resultant down-sampled time-varying signal, $e_A$, the power provided to the power amplifier of the transmit chain.

17. A design structure encoded on a non-transitory machine-readable medium, said design structure comprising elements that, when processed in a computer-aided design system, generate a machine-executable representation of a digital predistorter comprising:

a receiving circuit to receive an input signal, u, and a first signal that depends on amplitude variations based on the input signal, u, wherein the variations of the first signal correspond to time variations in non-linear characteristics of a transmit chain that includes a power amplifier, wherein the receiving circuit configured to receive the first signal is configured to monitor a time-varying signal e generated by an envelope tracker of the input signal u;

a generating circuit to:

generate based at least in part on signals comprising the input signal u and the first time-varying signal e, a digitally predistorted signal v to mitigate the non-linear behavior of the transmit chain; and generate, based on the received time-varying signal e, a resultant time-varying signal, $e_A$, through digital predistortion performed on the signals comprising the input signal u and the time-varying signal e;

provide the time varying signal, $e_A$, for controlling power provided to the power amplifier of the transmit chain; and an output circuit to provide the predistorted signal v to the transmit chain.

18. A non-transitory computer readable media programmed with instructions, executable on a processor, to:

receive a first signal that depends on amplitude variations based on an input signal, u, wherein the variations of the first signal correspond to time variations in non-linear characteristics of a transmit chain that includes a power amplifier, wherein the instructions to receive the first signal include one or more instructions to monitor by a time-varying signal e generated by an envelope tracker of the input signal u;

receive the input signal u;

generate, based on the received time-varying signal e, a resultant time-varying signal, $e_A$, through digital predistortion performed on the signals comprising the input signal u and the time-varying signal e;

provide the time varying signal, $e_A$, for controlling power provided to the power amplifier of the transmit chain; and generate based at least in part on signals comprising the input signal u and the time-varying signal e, a digitally predistorted signal v to mitigate the non-linear behavior of the transmit chain; and provide the predistorted signal v to the transmit chain.

* * * * *